US012587156B2

(12) United States Patent
Sato et al.

(10) Patent No.: US 12,587,156 B2
(45) Date of Patent: Mar. 24, 2026

(54) MULTILAYERED FILTER DEVICE

(71) Applicant: TDK CORPORATION, Tokyo (JP)

(72) Inventors: Takuya Sato, Tokyo (JP); Yuki Matsumoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 166 days.

(21) Appl. No.: 18/538,245

(22) Filed: Dec. 13, 2023

(65) Prior Publication Data

US 2024/0204742 A1 Jun. 20, 2024

(30) Foreign Application Priority Data

Dec. 20, 2022 (JP) ................................. 2022-203463

(51) Int. Cl.
*H03H 7/01* (2006.01)
*H03H 1/00* (2006.01)
(52) U.S. Cl.
CPC ........ *H03H 7/0115* (2013.01); *H03H 7/1775* (2013.01); *H03H 2001/0085* (2013.01)
(58) Field of Classification Search
CPC ............... H03H 7/0115; H03H 7/1775; H03H 2001/0085

USPC ......................................................... 333/185
See application file for complete search history.

(56) References Cited

U.S. PATENT DOCUMENTS

2023/0188111 A1 6/2023 Ogawa

FOREIGN PATENT DOCUMENTS

JP 7578142 B2 * 11/2024 .......... H01P 1/20345

* cited by examiner

*Primary Examiner* — Andrea Lindgren Baltzell
*Assistant Examiner* — Abigail Amir Yaldo
(74) *Attorney, Agent, or Firm* — Oliff PLC

(57) ABSTRACT

A filter device includes a plurality of resonators and a stack. The plurality of resonators include a first parallel resonator and a first serial resonator. The first parallel resonator includes a conductor structure wound around an axis extending in a direction orthogonal to a stacking direction. The first serial resonator includes a conductor layer wound around an axis extending in a direction parallel to the stacking direction. The conductor layer includes three portions each located between a corresponding one of three side surfaces and at least part of the conductor structure when seen in the stacking direction.

16 Claims, 25 Drawing Sheets

MULTILAYERED FILTER DEVICE

CROSS REFERENCE TO RELATED APPLICATIONS

This application claims the benefit of Japanese Priority Patent Application No. 2022-203463 filed on Dec. 20, 2022, the entire contents of which are incorporated herein by reference.

BACKGROUND OF THE INVENTION

1. Field of the Invention

The present invention relates to a multilayered filter device including a plurality of resonators.

2. Description of the Related Art

One of electronic components used in a communication apparatus is a band-pass filter including a plurality of resonators. Miniaturization of band-pass filters used in small-sized communication apparatuses, in particular, has been desired. One known example of a band-pass filter suitable for miniaturizing is a band-pass filter using a stack including a plurality of dielectric layers and a plurality of conductor layers stacked together.

As such a resonator used for a band-pass filter using a stack, known examples are a conductor layer type resonator including one or more conductor layers wound around an axis parallel to a stacking direction of a plurality of dielectric layers and a conductor structure type resonator including a conductor structure composed of a conductor layer and a plurality of through holes and wound around an axis orthogonal to the stacking direction of the plurality of dielectric layers.

Note that a "wound conductor layer (conductor structure)" includes a conductor layer (conductor structure) having the number of windings of ¾ in addition to a conductor layer (conductor structure) having the number of windings of one or more but does not include a conductor layer (conductor structure) having the number of windings of ½ or less. A resonator including a conductor layer (conductor structure) having the number of windings of ½ or less is also referred to as a non-wound resonator below.

US 2023/0188111 A1 discloses a filter device including a plurality of non-wound resonators, a filter device including a plurality of conductor structure type resonators and a plurality of non-wound resonators, and a filter device including a plurality of conductor layer type resonators and a plurality of non-wound resonators.

Some band-pass filters are desired to include a plurality of resonators each having a high inductance. In this case, to miniaturize such a band-pass filter, resonators each including a wound conductor layer (conductor structure) is preferably used. However, in a case where all the plurality of resonators are composed of conductor layer type resonators or conductor structure type resonators, there arise a problem that miniaturization is difficult due to a structural restriction and a problem that miniaturization is difficult due to a characteristic restriction in which the electromagnetic coupling between the resonators is too strong to obtain desired characteristics.

SUMMARY OF THE INVENTION

An object of the present invention is to provide a multilayered filter device that can be miniaturized while achieving desired characteristics in a filter device including a plurality of resonators.

A multilayered filter device according to the present invention includes a first terminal, a second terminal, a plurality of resonators arranged between the first terminal and the second terminal in a circuit configuration, and a stack for integrating the first terminal, the second terminal, and the plurality of resonators, the stack including a plurality of dielectric layers stacked together. The plurality of resonators include at least one parallel resonator having both ends connected to a path connecting the first terminal and the second terminal and at least one serial resonator having only one end connected to the path. The at least one parallel resonator includes a conductor structure wound around an axis extending in a direction orthogonal to a stacking direction of the plurality of dielectric layers. The at least one serial resonator includes a first conductor layer wound around an axis extending in a direction parallel to the stacking direction. The stack has a first surface and a second surface located at both ends in the stacking direction, and four side surfaces connecting the first surface and the second surface. The first conductor layer includes three portions each located between a corresponding one of three side surfaces of the four side surfaces and at least part of the conductor structure when seen in the stacking direction.

In the multilayered filter device according to the present invention, the first conductor layer of the at least one serial resonator includes three portions each located between a corresponding one of three side surfaces of the four side surfaces and at least part of the conductor structure of at least one parallel resonator when seen in the stacking direction. Thus, according to the present invention, it is possible to achieve miniaturization while achieving desired characteristics.

Other and further objects, features, and advantages of the present invention will appear more fully from the following description.

DETAILED DESCRIPTION OF THE PREFERRED EMBODIMENTS

First Embodiment

Figure 1:
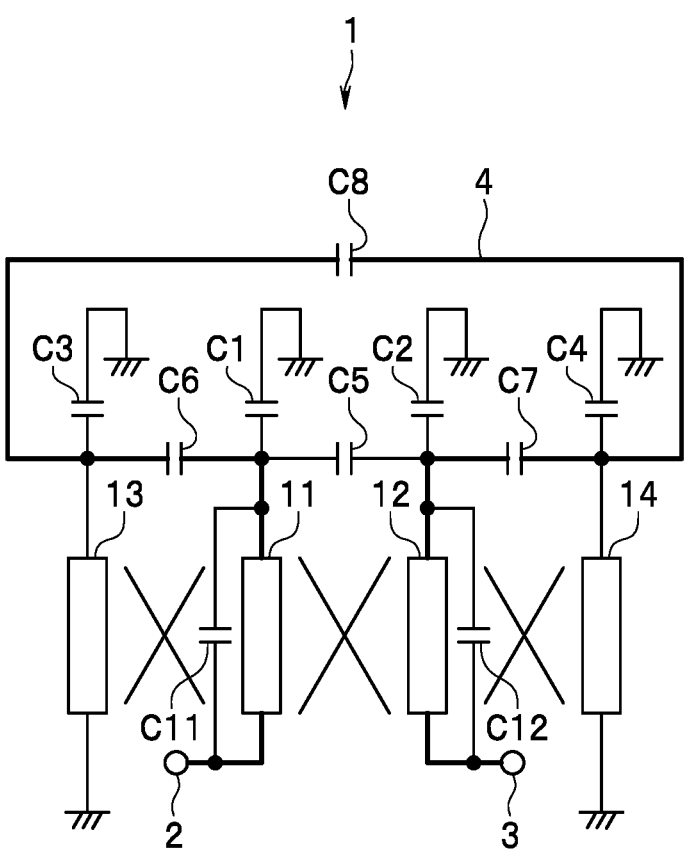
FIG. 1 is a circuit diagram showing a circuit configuration of a multilayered filter device according to a first embodiment of the present invention.

Embodiments of the present invention will now be described in detail with reference to the drawings. First, reference is made to FIG. 1 to describe a configuration of a multilayered filter device (hereinafter referred to simply as a filter device) 1 according to a first embodiment of the present invention. FIG. 1 is a circuit diagram showing a circuit configuration of the filter device 1. FIG. 1 shows a band-pass filter as an example of the filter device 1. The filter device 1 includes a first terminal 2, a second terminal 3, and a plurality of resonators. Each of the first and second terminals 2 and 3 is a terminal for inputting or outputting a signal.

The plurality of resonators are provided between the first terminal 2 and the second terminal 3 in the circuit configuration. In the present application, the expression of "in the (a) circuit configuration" is used to indicate not layout in physical configuration but layout in the circuit diagram.

The filter device 1 further includes a path 4 connecting the first terminal 2 and the second terminal 3. In the present application, the path 4 is defined as a path in a circuit diagram, the path connecting the first terminal 2 and the second terminal 3 without being routed through the ground. To facilitate understanding, the path 4 is illustrated with thick lines in FIG. 1.

The plurality of resonators include at least one parallel resonator and at least one serial resonator. The at least one parallel resonator is connected, at both ends thereof, to the path 4. The at least one serial resonator is connected, at only one end thereof, to the path 4. The at least one parallel resonator and the at least one serial resonator may be connected directly to the path 4 or may be connected to the path 4 via an inductor or a capacitor.

An example of the circuit configuration of the filter device 1 will be described below with reference to FIG. 1. The filter device 1 further includes capacitors C1, C2, C3, C4, C5, C6, C7, C11, and C12. The at least one parallel resonator includes a first parallel resonator 11 and a second parallel resonator 12. The at least one serial resonator includes a first serial resonator 13 and a second serial resonator 14. The path 4 also serves as a path to which the first and second parallel resonators 11 and 12 and the first and second serial resonators 13 and 14 are all connected, among a plurality of paths connecting the first terminal 2 and the second terminal 3.

One end and another end of the first parallel resonator 11 are connected to the path 4. The one end of the first parallel resonator 11 is connected to the first terminal 2. The capacitor C11 is connected in parallel with the first parallel resonator 11. One end of the capacitor C1 is connected to the other end of the first parallel resonator 11. Another end of the capacitor C1 is connected to the ground.

One end and another end of the second parallel resonator 12 are connected to the path 4. The one end of the second parallel resonator 12 is connected to the second terminal 3. The capacitor C12 is connected in parallel with the second parallel resonator 12. One end of the capacitor C2 is connected to the other end of the second parallel resonator 12. Another end of the capacitor C2 is connected to the ground.

One end of the first serial resonator 13 is connected to the path 4. Another end of the first serial resonator 13 is connected to the ground. One end of the capacitor C3 is connected to the one end of the first serial resonator 13. Another end of the capacitor C3 is connected to the ground.

One end of the second serial resonator 14 is connected to the path 4. Another end of the second serial resonator 14 is connected to the ground. One end of the capacitor C4 is connected to the one end of the second serial resonator 14. Another end of the capacitor C4 is connected to the ground.

One end of the capacitor C5 is connected to the other end of the first parallel resonator 11. Another end of the capacitor C5 is connected to the other end of the second parallel resonator 12.

The capacitors C6, C7, and C8 are provided on the path 4. One end of the capacitor C6 is connected to the other end of the first parallel resonator 11. Another end of the capacitor C6 and one end of the capacitor C8 are connected to the one end of the first serial resonator 13. One end of the capacitor C7 is connected to the other end of the second parallel resonator 12. Another end of the capacitor C7 and another end of the capacitor C8 are connected to the one end of the second serial resonator 14.

The first parallel resonator 11 and the second parallel resonator 12 are magnetically coupled with each other. The first parallel resonator 11 and the first serial resonator 13 are magnetically coupled with each other. The second parallel resonator 12 and the second serial resonator 14 are magnetically coupled with each other.

Here, in the circuit configuration, a part including the first terminal 2, the first parallel resonator 11, and the first serial resonator 13 is referred to as a first circuit element group. In the circuit configuration, a part including the second terminal 3, the second parallel resonator 12, and the second serial resonator 14 is referred to as a second circuit element group. The first circuit element group and the second circuit element group have circuit configurations symmetrical to each other. In other words, the first circuit element group and the second circuit element group can be illustrated to be symmetrical to each other in a circuit diagram. The first circuit element group may further include the capacitors C1, C3, C6, and C11, and the second circuit element group may further include the capacitors C2, C4, C7, and C12.

Figure 2:
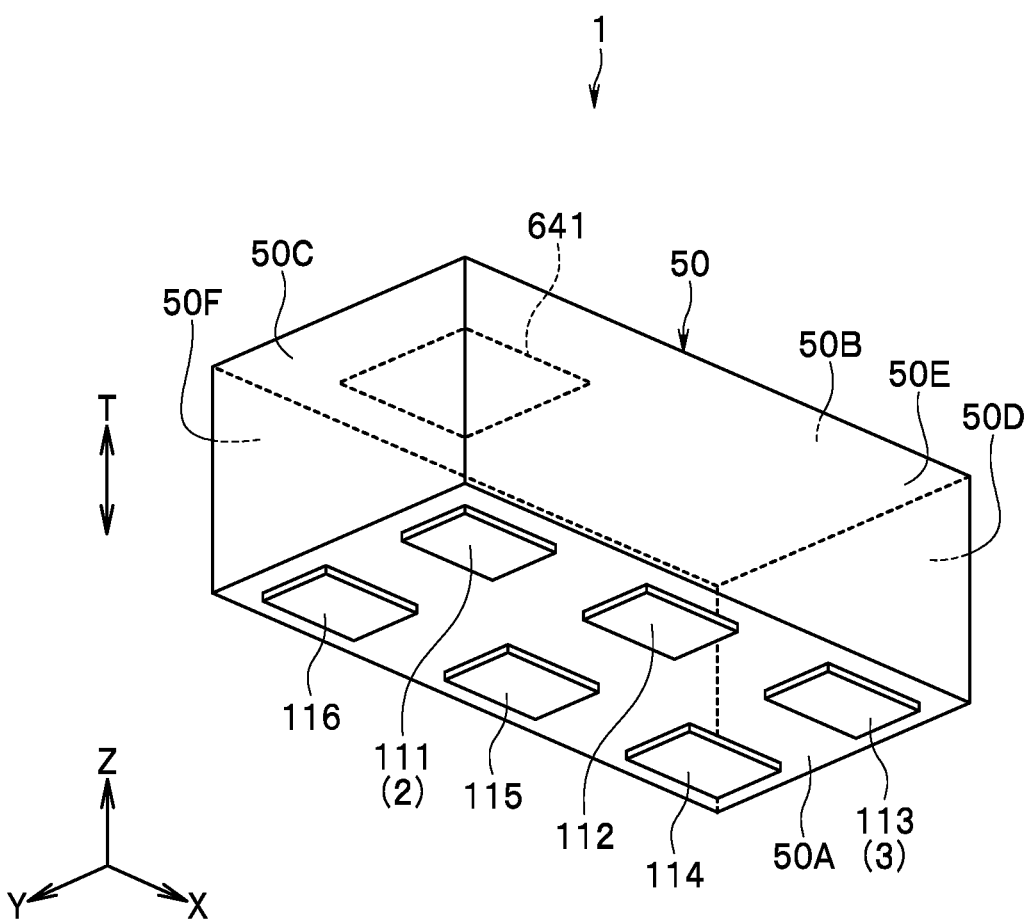
FIG. 2 is a perspective view showing an external appearance of the multilayered filter device according to the first embodiment of the present invention.

Next, other configurations of the filter device 1 will be described with reference to FIG. 2. FIG. 2 is a perspective view showing an external appearance of the filter device 1.

The filter device 1 further includes a stack 50 including a plurality of dielectric layers and a plurality of conductors stacked together. The first terminal 2, the second terminal 3, the plurality of resonators, and the capacitors C1 to C7, C11, and C12 are integrated with the stack 50.

The stack 50 has a first surface 50A and a second surface 50B located at both ends in a stacking direction T of the plurality of dielectric layers, and four side surfaces 50C to 50F connecting the first surface 50A and the second surface 50B. The side surfaces 50C and 50D are opposite to each other. The side surfaces 50E and 50F are opposite to each other. The side surfaces 50C to 50F are perpendicular to the first surface 50A and the second surface 50B.

Here, X, Y, and Z directions are defined as shown in FIG. 2. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively. The expression "when seen in the stacking direction T" means to see an object from a position away in the Z direction or the −Z direction.

As shown in FIG. 2, the first surface 50A is located at the end of the stack 50 in the −Z direction. The first surface 50A also serves as the bottom surface of the stack 50. The second surface 50B is located at the end of the stack 50 in the Z direction. The second surface 50B also serves as the top surface of the stack 50. The shape of each of the first surface 50A and the second surface 50B is a rectangular shape being long in the X direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The filter device 1 further includes electrodes 111, 112, 113, 114, 115, and 116 arranged on the first surface 50A of the stack 50. The electrodes 111, 112, and 113 are arranged in this order in the X direction at a position closer to the side surface 50E than the side surface 50F. The electrodes 114, 115, and 115 are arranged in this order in the −X direction at a position closer to the side surface 50F than the side surface 50E.

The electrode 111 corresponds to the first terminal 2. The electrode 113 corresponds to the second terminal 3. The electrode 115 is connected to the ground. Each of the electrodes 112, 114, and 116 may be connected but need not be connected to the ground.

Next, an example of the plurality of dielectric layers, the plurality of conductor layers, and a plurality of through holes constituting the stack 50 will be described with reference to FIG. 3A to FIG. 6. In this example, the stack 50 includes fourteen dielectric layers stacked together. The fourteen dielectric layers will be referred to below as first to fourteenth dielectric layers in the order from bottom to top. The first to fourteenth dielectric layers are denoted by reference numerals 51 to 64, respectively.

In FIG. 3A to FIG. 5B, each of a plurality of circles represents a through hole. The dielectric layers 51 to 62 each have a plurality of through holes. The plurality of through holes are each formed by filling a hole intended for a through hole with a conductive paste. Each of the plurality of through holes is connected to an electrode, a conductor layer, or another through hole.

In FIG. 3A to FIG. 5B, a plurality of specific through holes among the plurality of through holes are denoted by reference numerals. For a connection relationship between each of the plurality of specific through holes and an electrode, a conductor layer, or another through hole, the connection relationship in a state where the first to fourteenth dielectric layers 51 to 64 are stacked together is described.

Figure 3A:
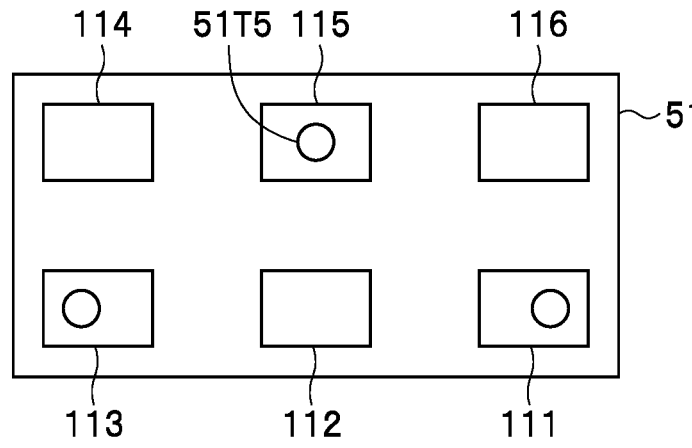
FIG. 3A to FIG. 3C are explanatory diagrams showing respective patterned surfaces of first to third dielectric layers of a stack of the multilayered filter device according to the first embodiment of the present invention.

FIG. 3A shows a patterned surface of the first dielectric layer 51. The electrodes 111 to 116 are formed on the patterned surface of the dielectric layer 51. The through hole denoted by a reference numeral 51T5 in FIG. 3A is connected to the electrode 115. Note that the through hole denoted by the reference numeral 51T5 will be simply referred to as a through hole 51T5 in the following description. The through holes denoted by other reference numerals than the through hole 51T5 are referred to similarly to the through hole 51T5.

Figure 3B:
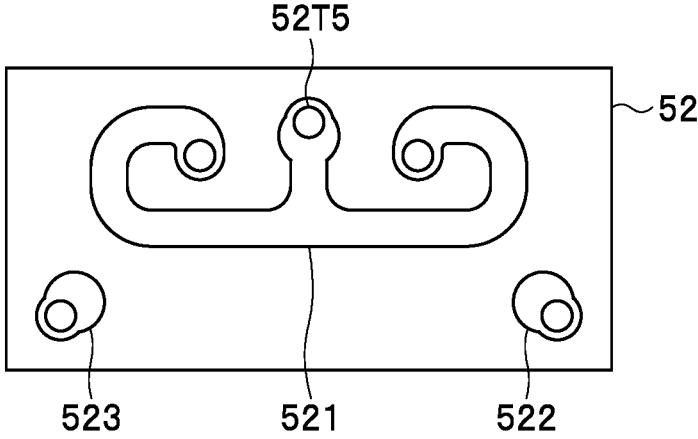

FIG. 3B shows a patterned surface of the second dielectric layer 52. Conductor layers 521, 522, and 523 are formed on the patterned surface of the dielectric layer 52. A through hole 52T5 shown in FIG. 3B and the through hole 51T5 formed in the dielectric layer 51 are connected to the conductor layer 521.

Figure 3C:
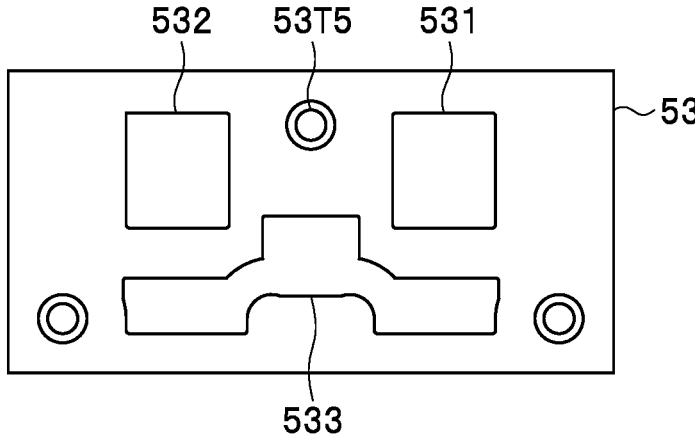

FIG. 3C shows a patterned surface of the third dielectric layer 53. Conductor layers 531, 532, and 533 are formed on the patterned surface of the dielectric layer 53. A through hole 53T5 shown in FIG. 3C is connected to the through hole 52T5 formed in the dielectric layer 52.

Figure 4A:
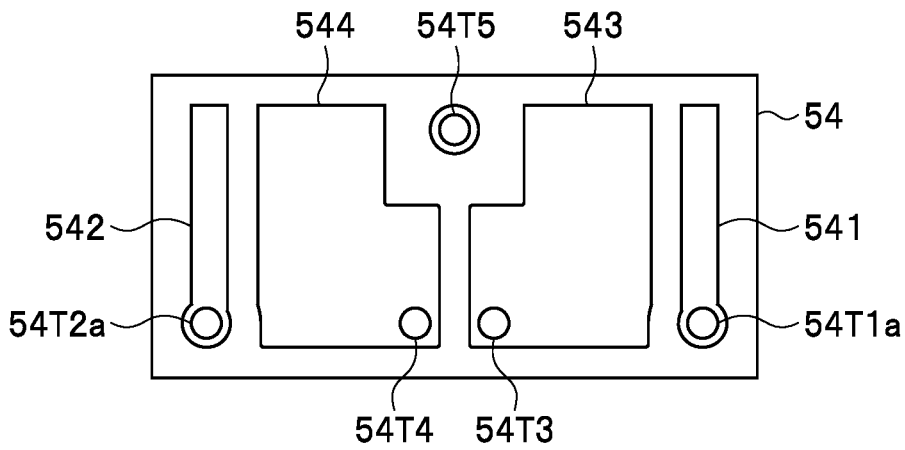
FIG. 4A to FIG. 4C are explanatory diagrams showing respective patterned surfaces of fourth to sixth dielectric layers of the stack of the multilayered filter device according to the first embodiment of the present invention.

FIG. 4A shows a patterned surface of the fourth dielectric layer 54. Conductor layers 541, 542, 543, and 544 are formed on the patterned surface of the dielectric layer 54. Through holes 54T1a, 54T2a, 54T3, and 54T4 shown in FIG. 4A are connected to the conductor layers 541, 542, 543, and 544, respectively. A through hole 54T5 is connected to the through hole 53T5 formed in the dielectric layer 53.

Figure 4B:
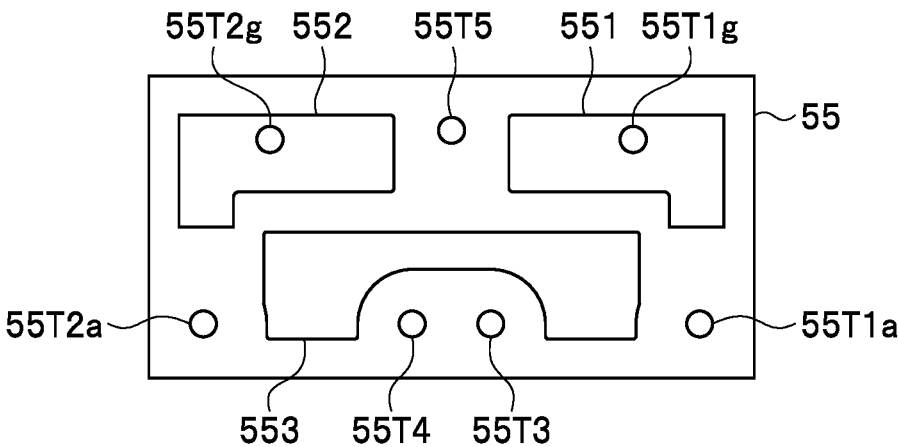

FIG. 4B shows a patterned surface of the fifth dielectric layer 55. Conductor layers 551, 552, and 553 are formed on the patterned surface of the dielectric layer 55. Through holes 55T1a, 55T2a, 55T3, 55T4, and 55T5 shown in FIG. 4B are connected respectively to the through holes 54T1a, 54T2a, 54T3, 54T4, and 54T5 formed in the dielectric layer 54. Through holes 55T1g and 55T2g are connected to the conductor layers 551 and 552, respectively.

Figure 4C:
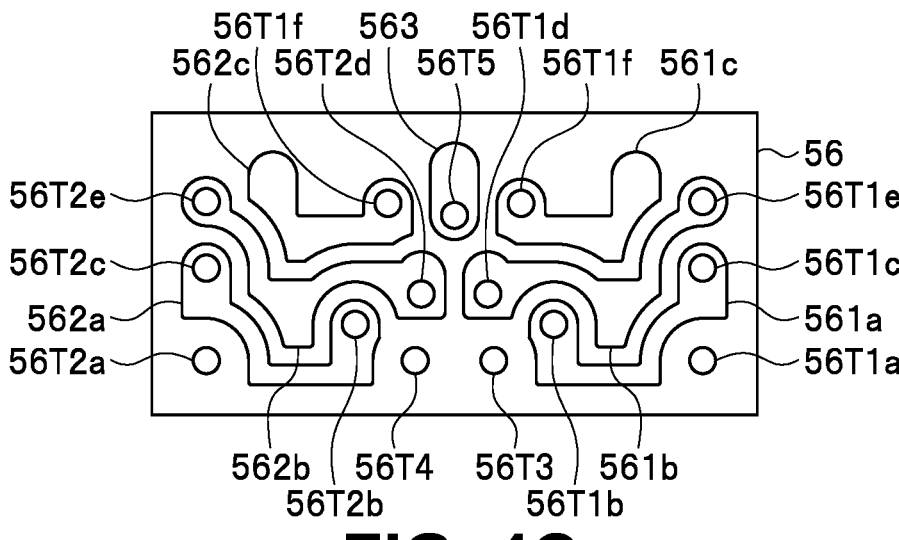

FIG. 4C shows a patterned surface of the sixth dielectric layer 56. Resonator conductor layers 561a, 561b, 561c, 562a, 562b, and 562c and a conductor layer 563 are formed on the patterned surface of the dielectric layer 56. Each of the conductor layers 561a to 561c and 562a to 562c has a first end and a second end opposite to each other.

Through holes 56T1a, 56T2a, 56T3, and 56T4 shown in FIG. 4C are connected respectively to the through holes 55T1a, 55T2a, 55T3, and 55T4 formed in the dielectric layer 55.

A through hole 56T1b is connected to a portion near the first end of the conductor layer 561a. A through hole 56T1c is connected to a portion near the second end of the conductor layer 561a. A through hole 56T1d is connected to a portion near the first end of the conductor layer 561b. A through hole 56T1e is connected to a portion near the second end of the conductor layer 561b. A through hole 56T1f is connected to a portion near the first end of the conductor layer 561c. The through hole 55T1g formed in the dielectric layer 55 is connected to a portion near the second end of the conductor layer 561c.

A through hole 56T2b is connected to a portion near the first end of the conductor layer 562a. A through hole 56T2c is connected to a portion near the second end of the conductor layer 562a. A through hole 56T2d is connected to a portion near the first end of the conductor layer 562b. A through hole 56T2e is connected to a portion near the second end of the conductor layer 562b. A through hole 56T2f is connected to a portion near the first end of the conductor layer 562c. The through hole 55T2g formed in the dielectric layer 55 is connected to a portion near the second end of the conductor layer 562c.

A through hole 56T5 and the through hole 55T5 formed in the dielectric layer 55 are connected to the conductor layer 563.

Figure 5A:
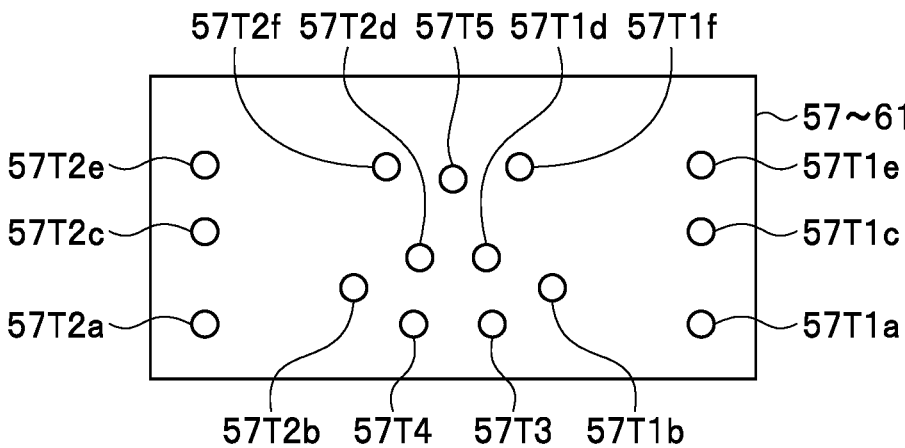
FIG. 5A is an explanatory diagram showing a patterned surface of each of seventh to eleventh dielectric layers of the stack of the multilayered filter device according to the first embodiment of the present invention.

FIG. 5A shows a patterned surface of each of the seventh to eleventh dielectric layers 57 to 61. Through holes 57T1a, 57T1b, 57T1c, 57T1d, 57T1e, 57T1f, 57T2a, 57T2b, 57T2c, 57T2d, 57T2e, 57T2f, 57T3, 57T4, and 57T5 are formed in each of the dielectric layers 57 to 61. The through holes 57T1a to 57T1f, 57T2a to 57T2f, and 57T3 to 57T5 formed in the dielectric layer 57 are connected respectively to the through holes 56T1a to 56T1f, 56T2a to 56T2f, and 56T3 to 56T5 formed in the dielectric layer 56. In the dielectric layers 57 to 61, vertically adjacent through holes denoted by the same reference numerals are connected to each other.

Figure 5B:
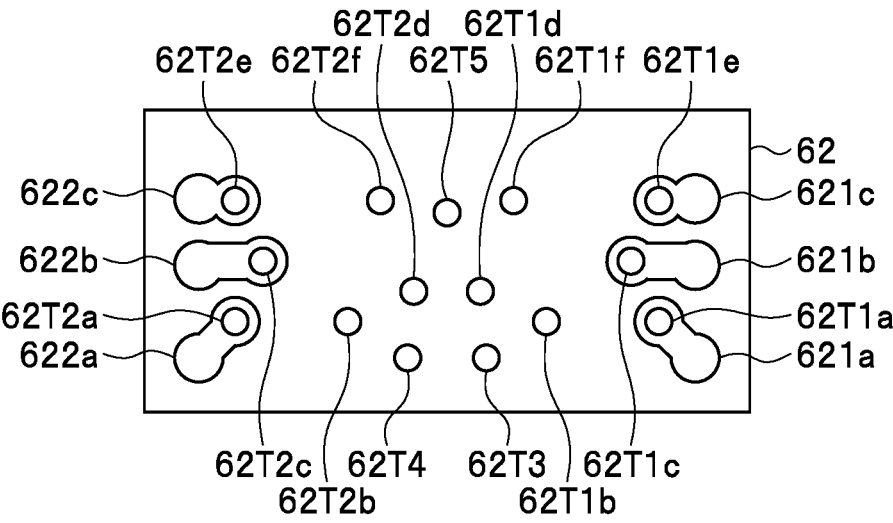
FIG. 5B is an explanatory diagram showing a patterned surface of a twelfth dielectric layer of the stack of the multilayered filter device according to the first embodiment of the present invention.

FIG. 5B shows a patterned surface of the twelfth dielectric layer 62. Resonator conductor layers 621a, 621b, 621c, 622a, 622b, and 622c are formed on the patterned surface of the dielectric layer 62. A through hole 62T1a shown in FIG. 5B and the through hole 57T1a that is formed in the dielectric layer 61 are connected to the conductor layer 621a. A through hole 62T1c and the through hole 57T1c that is formed in the dielectric layer 61 are connected to the conductor layer 621b. A through hole 62T1e and the through hole 57T1e that is formed in the dielectric layer 61 are connected to the conductor layer 621c.

A through hole 62T2a and the through hole 57T2a that is formed in the dielectric layer 61 are connected to the conductor layer 622a. A through hole 62T2c and the through hole 57T2c that is formed in the dielectric layer 61 are connected to the conductor layer 622b. A through hole 62T2e and the through hole 57T2e that is formed in the dielectric layer 61 are connected to the conductor layer 622c.

Through holes 62T1b, 62T1d, 62T1f, 62T2b, 62T2d, 62T2f, and 62T3 to 62T5 are connected respectively to the through holes 57T1b, 57T1d, 57T1f, 57T2b, 57T2d, 57T2f, and 57T3 to 57T5 formed in the dielectric layer 61.

Figure 5C:
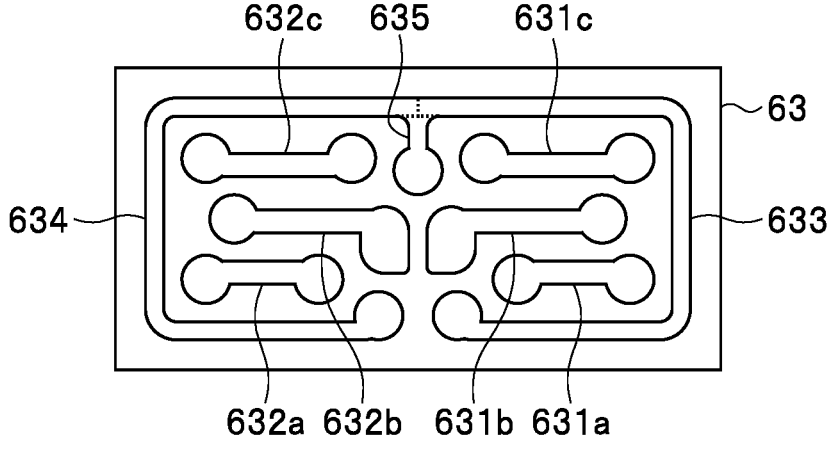
FIG. 5C is an explanatory diagram showing a patterned surface of a thirteenth dielectric layer of the stack of the multilayered filter device according to the first embodiment of the present invention.

FIG. 5C shows a patterned surface of the thirteenth dielectric layer 63. Resonator conductor layers 631a, 631b, 631c, 632a, 632b, 632c, 633, and 634 and a conductor layer 635 are formed on the patterned surface of the dielectric layer 63. Each of the conductor layers 631a to 631c, 632a to 632c, 633, and 634 has a first end and a second end opposite to each other. The second end of the conductor layer 633 and the second end of the conductor layer 634 are connected to each other. The conductor layer 635 is connected to the conductor layers 633 and 634 near the boundary between the conductor layer 633 and the conductor layer 634. In FIG. 5C, each boundary between the conductor layers 633, 634, and 635 is indicated by a dotted line.

The through hole 62T1a formed in the dielectric layer 62 is connected to a portion near the first end of the conductor layer 631a. The through hole 62T1b formed in the dielectric layer 62 is connected to a portion near the second end of the conductor layer 631a. The through hole 62T1c formed in the dielectric layer 62 is connected to a portion near the first end of the conductor layer 631b. The through hole 62T1d formed in the dielectric layer 62 is connected to a portion near the second end of the conductor layer 631b. The through hole 62T1e formed in the dielectric layer 62 is connected to a portion near the first end of the conductor layer 631c. The through hole 62T1f formed in the dielectric layer 62 is connected to a portion near the second end of the conductor layer 631c.

The through hole 62T2a formed in the dielectric layer 62 is connected to a portion near the first end of the conductor layer 632a. The through hole 62T2b formed in the dielectric layer 62 is connected to a portion near the second end of the conductor layer 632a. The through hole 62T2c formed in the dielectric layer 62 is connected to a portion near the first end of the conductor layer 632b. The through hole 62T2d formed in the dielectric layer 62 is connected to a portion near the second end of the conductor layer 632*b*. The through hole 62T2*e* formed in the dielectric layer 62 is connected to a portion near the first end of the conductor layer 632*c*. The through hole 62T2*f* formed in the dielectric layer 62 is connected to a portion near the second end of the conductor layer 632*c*.

The through hole 62T3 formed in the dielectric layer 62 is connected to a portion near the first end of the conductor layer 633. The through hole 62T4 formed in the dielectric layer 62 is connected to a portion near the first end of the conductor layer 634. The through hole 62T5 formed in the dielectric layer 62 is connected to the conductor layer 635.

Figure 6:
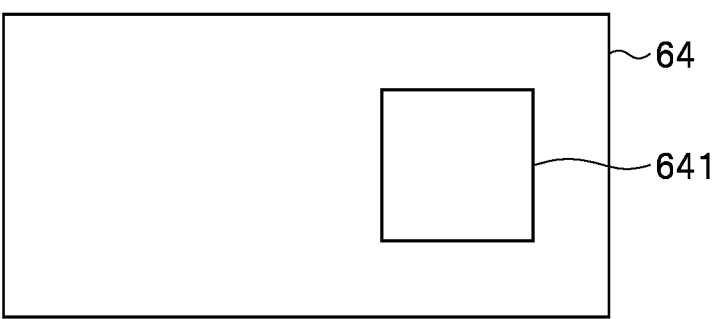
FIG. 6 is an explanatory diagram showing a patterned surface of a fourteenth dielectric layer of the stack of the multilayered filter device according to the first embodiment of the present invention.

FIG. 6 shows a patterned surface of the fourteenth dielectric layer 61. A mark 641 is formed on a patterned surface of the dielectric layer 64.

The stack 50 shown in FIG. 2 is formed by stacking the first to fourteenth dielectric layers 51 to 64 such that the patterned surface of the first dielectric layer 51 serves as the first surface 50A of the stack 50 and the surface of the fourteenth dielectric layer 64 opposite to the patterned surface thereof serves as the second surface 50B of the stack 50.

Each of the plurality of through holes shown in FIG. 3A to FIG. 5B is connected to a conductor layer overlapping in the stacking direction T or another through hole overlapping in the stacking direction T when the first to fourteenth dielectric layers 51 to 64 are stacked together. Of the plurality of through holes shown in FIG. 3A to FIG. 5B, ones located within an electrode or conductor layer are connected to the electrode or conductor layer.

Figure 7:
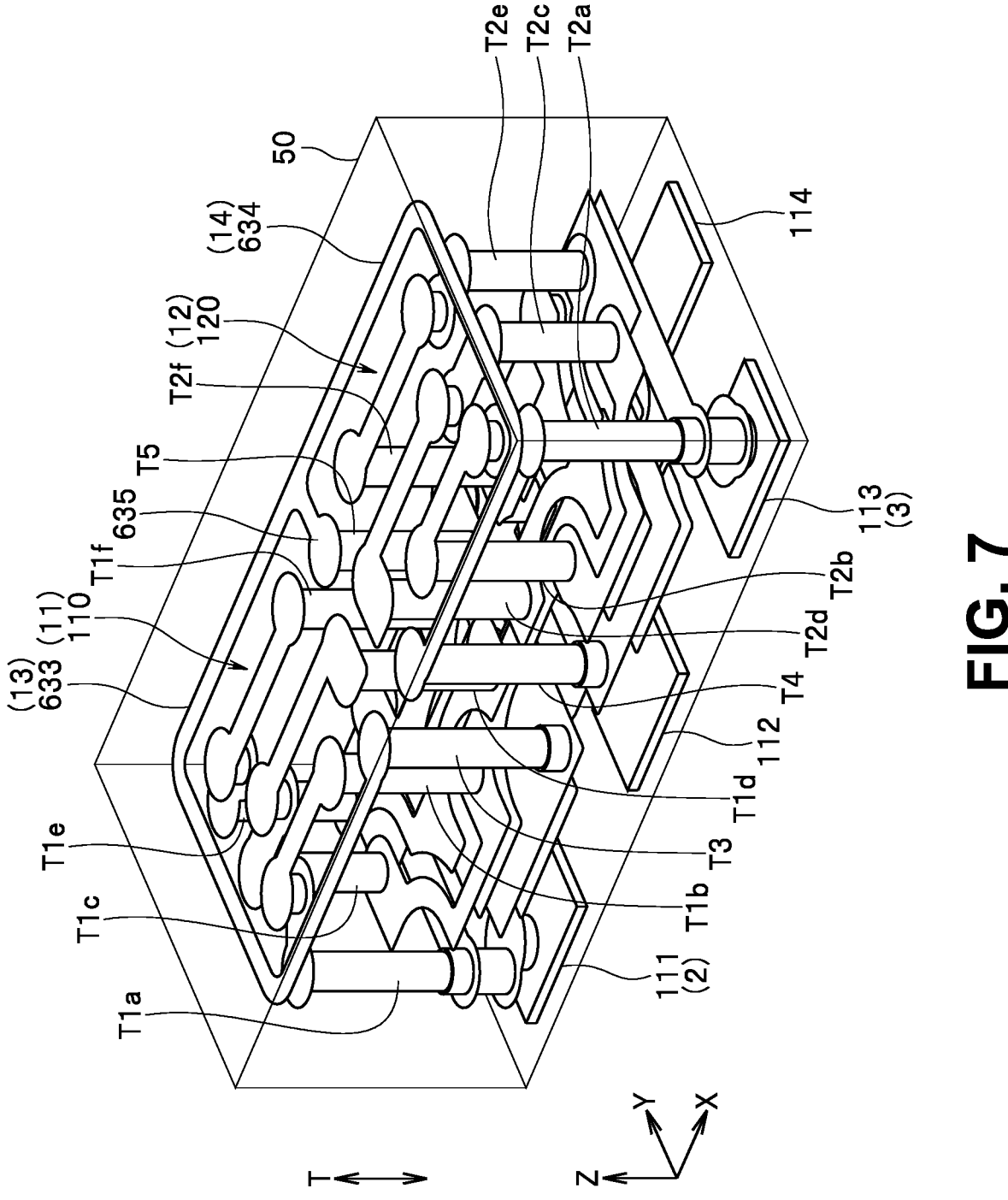
FIG. 7 is perspective view showing an internal structure of the stack of the multilayered filter device according to the first embodiment of the present invention.

FIG. 7 shows the internal structure of the stack 50 formed by stacking the first to fourteenth dielectric layers 51 to 64. As shown in FIG. 7, the plurality of conductor layers and the plurality of through holes shown in FIG. 3A to FIG. 5C are stacked inside the stack 50. Note that the mark 641 is omitted in FIG. 7.

Correspondences between the circuit components of the filter device 1 shown in FIG. 1 and the internal components of the stack 50 shown in FIG. 3A to FIG. 5C will now be described. The first parallel resonator 11 is composed of the conductor layers 561*a* to 561*c*, 621*a* to 621*c*, and 631*a* to 631*c* and the through holes 54T1*a*, 55T1*a*, 56T1*a* to 56T1*f*, 57T1*a* to 57T1*f*, and 62T1*a* to 62T1*f*.

The second parallel resonator 12 is composed of the conductor layers 562*a* to 562*c*, 622*a* to 622*c*, and 632*a* to 632*c* and the through holes 54T2*a*, 55T2*a*, 56T2*a* to 56T2*f*, 57T2*a* to 57T2*f*, and 62T2*a* to 62T2*f*.

The first serial resonator 13 is composed of the conductor layer 633. The second serial resonator 14 is composed of the conductor layer 634.

The capacitor C1 is composed of the conductor layers 521 and 541 and the dielectric layers 52 and 53 between the conductor layers. The capacitor C2 is composed of the conductor layers 521 and 542 and the dielectric layers 52 and 53 between the conductor layers. The capacitor C3 is composed of the conductor layers 531 and 543, and the dielectric layer 53 between the conductor layers. The capacitor C4 is composed of the conductor layers 532 and 544 and the dielectric layer 53 between the conductor layers.

The capacitor C5 is composed of the conductor layers 551 and 552. The capacitor C6 is composed of the conductor layers 543 and 551 and the dielectric layer 54 between the conductor layers. The capacitor C7 is composed of the conductor layers 544 and 552 and the dielectric layer 54 between the conductor layers. The capacitor C8 is composed of the conductor layers 533, 543, 544, and 553 and the dielectric layers 53 and 54 between the conductor layers.

The capacitor C11 is composed of the conductor layers 541 and 551 and the dielectric layer 54 between the conductor layers. The capacitor C12 is composed of the conductor layers 542 and 552 and the dielectric layer 54 between the conductor layers.

Figure 8:
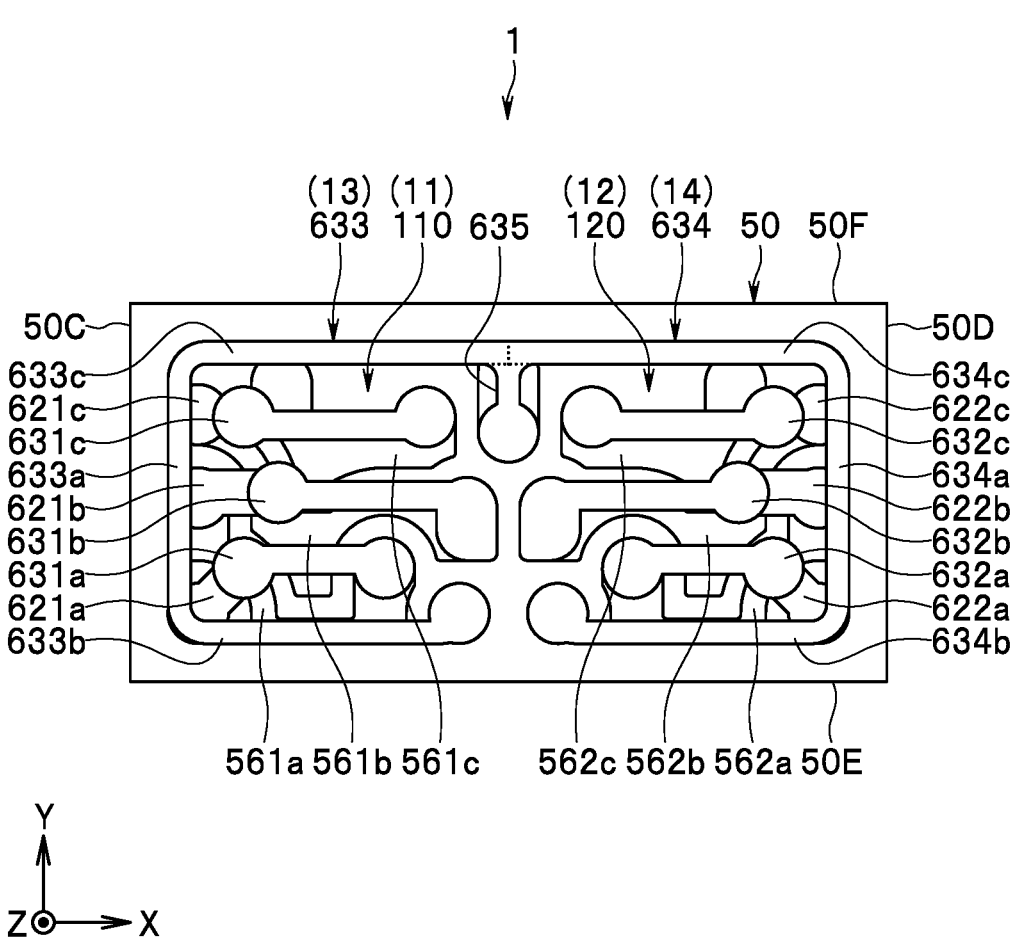
FIG. 8 is a plan view showing part of an internal structure of the stack shown in FIG. 7.

Next, the structural features of the filter device 1 according to the present embodiment will be described with reference to FIG. 2 to FIG. 8. FIG. 8 is a plan view showing part of an internal structure of the stack 50 shown in FIG. 7.

First, features of the first parallel resonator 11 will be described. The first parallel resonator 11 includes a conductor structure 110 wound around an axis extending in a direction orthogonal to the stacking direction T. In other words, the first parallel resonator 11 is a conductor structure type resonator.

The conductor structure 110 is also a rectangular or approximately rectangular winding. For the rectangular or approximately rectangular winding, the number of windings may be counted, when the winding is regarded as a rectangle, as ¼ per side of the rectangle. The number of windings of the conductor structure 110 is ¾ or more. In the present embodiment in particular, the conductor structure 110 is wound three times around an axis extending in a direction parallel to the Y direction.

Here, a structure formed with a plurality of through holes being connected in series is referred to as a through hole line. The conductor structure 110 includes through hole lines T1*a*, T1*b*, T1*c*, T1*d*, T1*e*, and T1*f*, the through holes 62T1*a*, 62T1*c*, and 62T1*e*, and the conductor layers 561*a* to 561*c*, 621*a* to 621*c*, and 631*a* to 631*c*.

The through hole line T1*a* is formed with the through holes 54T1*a*, 55T1*a*, 56T1*a*, and 57T1*a* being connected in series. The through hole line T1*b* is formed with the through holes 56T1*b*, 57T1*b*, and 62T1*b* being connected in series. The through hole line T1*c* is formed with the through holes 56T1*c* and 57T1*c* being connected in series. The through hole line T1*d* is formed with the through holes 56T1*d*, 57T1*d*, and 62T1*d* being connected in series. The through hole line T1*e* is formed with the through holes 56T1*e* and 57T1*e* being connected in series. The through hole line T1*f* is formed with the through holes 56T1*f*, 57T1*f*, and 62T1*f* being connected in series.

Each of the conductor layers 561*a* to 561*c* has a first end and a second end located at both ends of the corresponding one of the conductor layers 561*a* to 561*c* in a longitudinal direction. Each of the conductor layers 561*a* to 561*c* includes a portion closer to the side surface 50E than the first end and the second end of the corresponding one of the conductor layers 561*a* to 561*c* are.

The conductor layer 561*a* is electrically connected to one end of each of the through hole lines T1*b* and T1*c*. The conductor layer 561*b* is electrically connected to one end of each of the through hole lines T1*d* and T1*e*. The conductor layer 561*c* is electrically connected to one end of the through hole line T1*f*. The conductor layer 561*c* is electrically connected to the conductor layer 551 via the through hole 55T1*g*.

A large part of each of the conductor layers 631*a* to 631*c* extends in a direction parallel to the X direction. The conductor layer 631*a* is electrically connected to one end of the through hole line T1*a* and is also electrically connected to the other end of the through hole line T1*b*, via the conductor layer 621*a* and the through hole 62T1*a*. The conductor layer 631*b* is electrically connected to the other end of the through hole line T1*c* and is also electrically connected to the other end of the through hole line T1d, via the conductor layer 621b and the through hole 62T1c. The conductor layer 631c is electrically connected to the other end of the through hole line T1e and is also electrically connected to the other end of the through hole line T1f, via the conductor layer 621c and the through hole 62T1e.

The through hole lines T1a to T1f and the conductor layers 561a to 561c and 631a to 631c are connected in the order of the through hole line T1a, the conductor layer 631a, the through hole line T1b, the conductor layer 561a, the through hole line T1c, the conductor layer 631b, the through hole line T1d, the conductor layer 561b, the through hole line T1e, the conductor layer 631c, the through hole line T1f, and the conductor layer 561c to encircle an axis parallel to the Y direction.

Next, features of the second parallel resonator 12 will be described. The second parallel resonator 12 includes a conductor structure 120 wound around an axis extending in a direction orthogonal to the stacking direction T. In other words, the second parallel resonator 12 is a conductor structure type resonator. The number of windings of the conductor structure 120 is ¾ times or more. In the present embodiment in particular, the conductor structure 120 is wound three times around an axis extending in a direction parallel to the Y direction.

The conductor structure 120 includes through hole lines T2a, T2b, T2c, T2d, T2e, and T2f, the through holes 62T2a, 62T2c, and 62T2e, and the conductor layers 562a, 562b, 562c, 622a, 622b, 622c, 632a, 632b, and 632c.

By substituting the through hole lines T2a to T2f, the through holes 54T2a, 55T2a, 56T2a to 56T2f, 57T2a to 57T2f, and 62T2a to 62T2f, and the conductor layers 552, 562a to 562c, 622a to 622c, and 632a to 632c respectively for the through hole lines T1a to T1f, the through holes 54T1a, 55T1a, 56T1a to 56T1f, 57T1a to 57T1f, and 62T1a to 62T1f, and the conductor layers 551, 561a to 561c, 621a to 621c, and 631a to 631c in the description of the structure of the conductor structure 110, this serves as a description of a structure of the conductor structure 120.

Next, features of the first and the second serial resonators 13 and 14 will be described. The conductor layer 633 forming the first serial resonator 13 is wound around an axis extending in the direction parallel to the stacking direction T. In other words, the first serial resonator 13 is a conductor layer type resonator. The conductor layer 633 is also a rectangular or approximately rectangular winding. The number of windings of the conductor layer 633 is ¾ or more. In the present embodiment in particular, the conductor layer 633 is wound ¾ times around an axis extending in a direction parallel to the Z direction.

The conductor layer 633 is electrically connected to the conductor layer 543 via the through hole line T3. The through hole line T3 is formed with the through holes 54T3, 55T3, 56T3, 57T3, and 62T3 being connected in series.

The conductor layer 634 forming the second serial resonator 14 is wound around an axis extending in the direction parallel to the stacking direction T. In other words, the second serial resonator 14 is a conductor layer type resonator. The conductor layer 634 is also a rectangular or approximately rectangular winding. The number of windings of the conductor layer 634 is ¾ or more. In the present embodiment in particular, the conductor layer 634 is wound ¾ times around an axis extending in the direction parallel to the Z direction.

The conductor layer 634 is electrically connected to the conductor layer 544 via the through hole line T4. The through hole line T4 is formed with the through holes 54T4, 55T4, 56T4, 57T4, and 62T4 being connected in series.

Each of the conductor layers 633 and 634 is electrically connected to the through hole line T5 via the conductor layer 635. The through hole line T5 is formed with the through holes 52T5, 53T5, 54T5, 55T5, 56T5, 57T5, and 62T5 being connected in series. The through hole line T5 is electrically connected to the electrode 115 via the through hole 51T5 and the conductor layer 521.

Next, structural features of the filter device 1 will be described by focusing on the first parallel resonator 11 and the first serial resonator 13. The conductor structure 110 is wound around an axis extending in a direction different from the axis around which the conductor layer 633 is wound. The conductor structure 110 may be wound around an axis extending in a direction orthogonal to the axis around which the conductor layer 633 is wound. The number of windings of the conductor structure 110 is larger than the number of windings of the conductor layer 633. The length of the conductor structure 110 is larger than the length of the conductor layer 633.

As shown in FIG. 8, the conductor layer 633 includes three portions 633a, 633b, and 633c each located between a corresponding one of the side surfaces 50C, 50E, and 50F and at least part of the conductor structure 110 when seen in the stacking direction T. In the present embodiment in particular, the portion 633a is arranged between the side surface 50C and the conductor layers 631a to 631c. The portion 633b is arranged between the side surface 50E and the conductor layers 631a to 631c. The portion 633c is arranged between the side surface 50F and the conductor layers 631a to 631c.

The conductor layer 633 overlaps the conductor structure 110 when seen in the stacking direction T. In the present embodiment in particular, the conductor layer 633 overlaps part of each of the conductor layers 561a to 561c and 621a to 621c and the through hole lines T1a, T1c, and T1e. The conductor layer 633 and the conductor layers 631a to 631c are arranged at the same position in the stacking direction T. The conductor layer 633 does not overlap the conductor layers 631a to 631c.

Next, structural features of the filter device 1 will be described by focusing on the second parallel resonator 12 and the second serial resonator 14. The conductor structure 120 is wound around an axis extending in a direction different from the axis around which the conductor layer 634 is wound. The conductor structure 120 may be wound around an axis extending in a direction orthogonal to the axis around which the conductor layer 634 is wound. The number of windings of the conductor structure 120 is larger than the number of windings of the conductor layer 634. The length of the conductor structure 120 is larger than the length of the conductor layer 634.

As shown in FIG. 8, the conductor layer 634 includes three portions 634a, 634b, and 634c each located between a corresponding one of the side surfaces 50D, 50E, and 50F and at least part of the conductor structure 120 when seen in the stacking direction T. In the present embodiment in particular, the portion 634a is arranged between the side surface 50D and the conductor layers 632a to 632c. The portion 634b is arranged between the side surface 50E and the conductor layers 632a to 632c. The portion 634c is arranged between the side surface 50F and the conductor layers 632a to 632c.

The conductor layer 634 overlaps the conductor structure 120 when seen in the stacking direction T. In the present embodiment in particular, the conductor layer 634 overlaps part of each of the conductor layers 562a to 562c and 622a to 622c and the through hole lines T2a, T2c, and T2e. The conductor layer 634 and the conductor layers 632a to 632c are arranged at the same position in the stacking direction T. The conductor layer 634 does not overlap the conductor layers 632a to 632c.

Next, structural features of the filter device 1 will be described by focusing on the first parallel resonator 11 and the second parallel resonator 12. The conductor structure 110 of the first parallel resonator 11 is wound to form a first opening surrounded by the conductor structure 110. The conductor structure 120 of the second parallel resonator 12 is wound to form a second opening surrounded by the conductor structure 120. The conductor structures 110 and 120 are arranged so that the first opening and the second opening do not face each other. In the present embodiment in particular, the conductor structures 110 and 120 are arranged in a longitudinal direction (direction parallel to the X direction) of the plane shape of the stack 50 when seen in the stacking direction T.

Next, structural features of the filter device 1 will be described by focusing on the first serial resonator 13 and the second serial resonator 14. The conductor layer 633 of the first serial resonator 13 and the conductor layer 634 of the second serial resonator 14 are arranged in the longitudinal direction (direction parallel to the X direction) of the plane shape of the stack 50 when seen in the stacking direction T.

A first gap is formed between both ends of the conductor layer 633 in the longitudinal direction, in other words, the first end and the second end of the conductor layer 633. A second gap is formed between both ends of the conductor layer 634 in the longitudinal direction, in other words, the first end and the second end of the conductor layer 634. The first gap and the second gap are adjacent to each other in the direction orthogonal to the stacking direction T, in other words, the direction parallel to the X direction.

Figure 9:
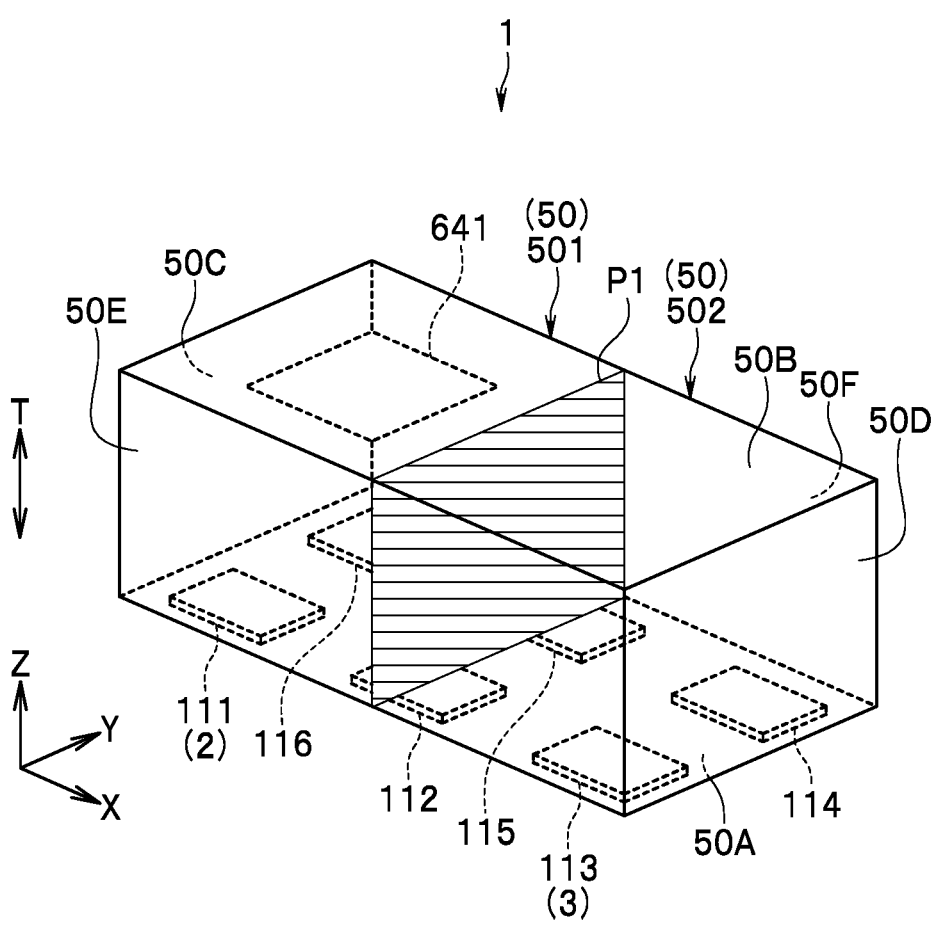
FIG. 9 is an explanatory diagram for describing a virtual plane in the first embodiment of the present invention.

Next, features of the plurality of conductors included in the stack 50 will be described. Here, a virtual plane P1 parallel to the stacking direction T will be defined. FIG. 9 is an explanatory diagram for describing the virtual plane P1. In the present embodiment in particular, the virtual plane P1 is a YZ plane intersecting the center of the first surface 50A or the second surface 50B in the longitudinal direction. Note that, in FIG. 9, for convenience, the virtual plane P1 is hatched. A portion of the stack 50 on a side surface 50C side with respect to the virtual plane P1 is referred to as a first portion 501. A portion of the stack 50 on a side surface 50D side with respect to the virtual plane P1 is referred to as a second portion 502.

A plurality of conductors (electrodes, plurality of conductor layers, and plurality of through holes) composing the part including the first terminal 2, the first parallel resonator 11, and the first serial resonator 13 in the stack 50 are referred to as a first conductor group. The first conductor group is arranged in the first portion 501.

A plurality of conductors (electrodes, plurality of conductor layers, and plurality of through holes) composing the part including the second terminal 3, the second parallel resonator 12, and the second serial resonator 14 in the stack 50 are referred to as a second conductor group. The second conductor group is arranged in the second portion 502.

The first conductor group is formed to be symmetrical to the second conductor group with the virtual plane P1 as the center. In other words, each of the plurality of conductors included in the first conductor group is formed to be symmetrical to a corresponding conductor of the plurality of conductors included in the second conductor group with the virtual plane P1 as the center.

The first conductor group may further include at least part of the plurality of conductor layers composing the capacitors C1, C3, C6, and C11, and the second conductor group may further include at least part of the plurality of conductor layers composing the capacitors C2, C4, C7, and C12.

Next, operation and effects of the filter device 1 according to the present embodiment will be described. In the present embodiment, the conductor layer 633 of the first serial resonator 13 includes the three portions 633a, 633b, and 633c each located between a corresponding one of the side surfaces 50C, 50E, and 50F and at least part of the conductor structure 110 of the first parallel resonator 11 when seen in the stacking direction T. In other words, the first parallel resonator 11 and the first serial resonator 13 are arranged to have such a positional relationship that the three portions 633a, 633b, and 633c are present between the side surfaces 50C, 50E, and 50F and at least part of the conductor structure 110. With this, according to the present embodiment, the space inside the stack 50 can be efficiently used to miniaturize the stack 50 and thus the filter device 1.

Moreover, according to the present embodiment, the conductor layer 633 can be long compared to a case where the conductor layer 633 includes only one or two of the three portions 633a, 633b, and 633c. With this, according to the present embodiment, the inductance of the first serial resonator 13 can be high.

In the present embodiment, the conductor structure 110 of the first parallel resonator 11 is wound around the axis extending in the direction orthogonal to the stacking direction T, concretely the direction parallel to the Y direction. The conductor layer 633 of the first serial resonator 13 is wound around the axis extending in the direction parallel to the stacking direction T, concretely the direction parallel to the Z direction. With this, according to the present embodiment, the direction of a magnetic field caused by the conductor structure 110 and the direction of a magnetic field caused by the conductor layer 633 can be made different from each other. Consequently, according to the present embodiment, the magnetic field coupling between the first parallel resonator 11 and the first serial resonator 13 can be suppressed compared to a case where the conductor structure 110 and the conductor layer 633 are each wound around the axis extending in the same direction and the opening of the conductor structure 110 and the opening of the conductor layer 633 face each other. With this, according to the present embodiment, the filter device 1 can be miniaturized by reducing the distance between the first parallel resonator 11 and the first serial resonator 13.

The description of the first parallel resonator 11 and the first serial resonator 13 above is also applicable to the second parallel resonator 12 and the second serial resonator 14.

In the present embodiment, the conductor structures 110 and 120 are arranged so that the first opening and the second opening do not face each other. With this, according to the present embodiment, the magnetic field coupling between the first parallel resonator 11 and the second parallel resonator 12 can be suppressed compared to a case where the conductor structures 110 and 120 are arranged so that the first opening and the second opening face each other.

In the present embodiment, the conductor layer 633 of the first serial resonator 13 and the conductor layer 634 of the second serial resonator 14 are arranged in the direction orthogonal to the stacking direction T, concretely the direction parallel to the X direction. With this, according to the present embodiment, the magnetic field coupling between the first serial resonator 13 and the second serial resonator 14 can be suppressed compared to a case where the opening of the conductor layer 633 and the opening of the conductor layer 634 face each other.

In the present embodiment, the conductor layers 633 and 634 are electrically connected to the electrode 115 via the common through hole line T5. However, the conductor layers 633 and 634 may be connected to the electrode 115 via different through hole lines. Alternatively, the conductor layers 633 and 634 may be connected to different electrodes via respective different through hole lines. In a case of using different through hole lines, the magnetic field coupling between the first serial resonator 13 and the second serial resonator 14 can be weakened.

In view of the above, according to the present embodiment, it is possible to miniaturize the filter device 1 while achieving desired characteristics.

Figure 10:
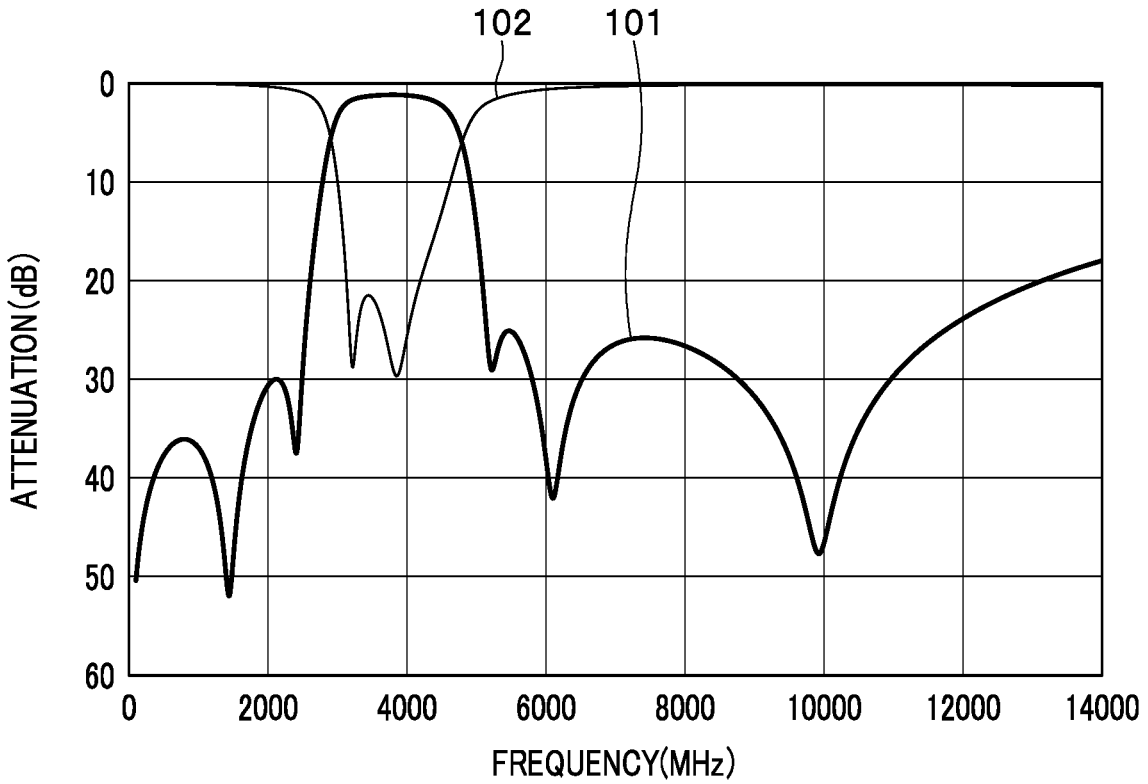
FIG. 10 is a characteristic chart showing an example of characteristics of the multilayered filter device according to the first embodiment of the present invention.

Next, an example of characteristics of the filter device 1 according to the present embodiment will be described. FIG. 10 shows an example of pass attenuation characteristics and return attenuation characteristics of the filter device 1. In FIG. 10, the horizontal axis represents frequency, and the vertical axis represents attenuation. In FIG. 10, a curve denoted by a reference numeral 101 represents the pass attenuation characteristics of the filter device 1. A curve denoted by a reference numeral 102 represents the return attenuation characteristics in the first terminal 2.

Second Embodiment

Next, a second embodiment of the present invention will be described. In the present embodiment, the stack 50 of the filter device 1 includes second to thirteenth dielectric layers 72 to 83 instead of the second to thirteenth dielectric layers 52 to 63 in the first embodiment. The stack 50 in the present embodiment is formed by stacking the first dielectric layer 51 (refer to FIG. 3A), the second to thirteenth dielectric layers 72 and 83, and the fourteenth dielectric layer 64 (refer to FIG. 6).

A plurality of conductor layers and a plurality of through holes formed in each of the second to thirteenth dielectric layers 72 to 83 will be described below with reference to FIG. 11A to FIG. 13C.

Figure 11A:
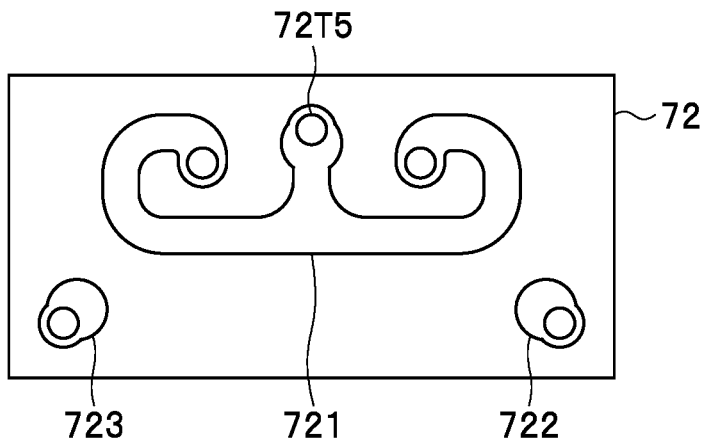
FIG. 11A to FIG. 11C are explanatory diagrams showing respective patterned surfaces of second to fourth dielectric layers of a stack of a multilayered filter device according to a second embodiment of the present invention.

FIG. 11A shows a patterned surface of the second dielectric layer 72. Conductor layers 721, 722, and 723 are formed on the patterned surface of the dielectric layer 72. A through hole 72T5 shown in FIG. 11A and the through hole 51T5 formed in the dielectric layer 51 (refer to FIG. 3A) are connected to the conductor layer 721.

Figure 11B:
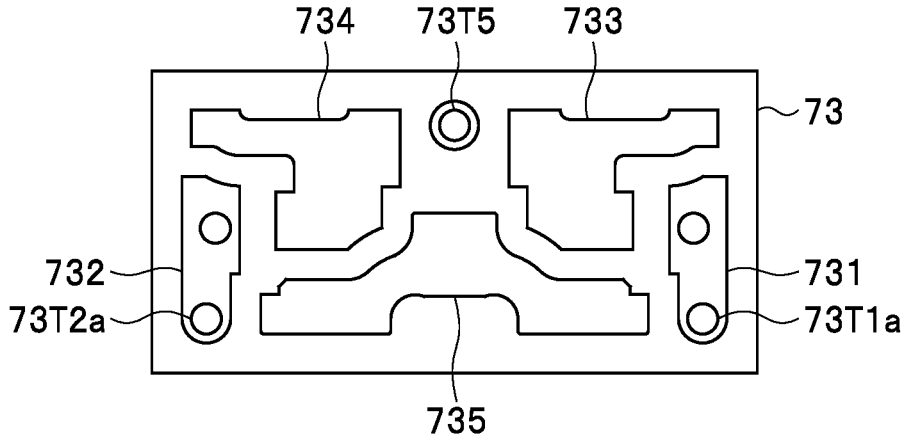

FIG. 11B shows a patterned surface of the third dielectric layer 73. Conductor layers 731, 732, 733, 734, and 735 are formed on the patterned surface of the dielectric layer 73. Through holes 73T1a and 73T2a shown in FIG. 11B are connected to the conductor layers 731 and 732, respectively. A through hole 73T5 is connected to the through hole 72T5 formed in the dielectric layer 72.

Figure 11C:
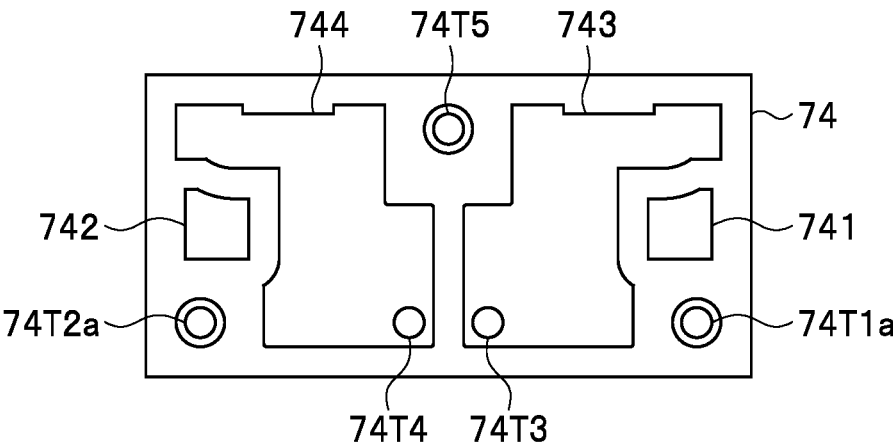

FIG. 11C shows a patterned surface of the fourth dielectric layer 74. Conductor layers 741, 742, 743, and 744 are formed on the patterned surface of the dielectric layer 74. Through holes 74T1a, 74T2a, and 74T5 shown in FIG. 11C are connected respectively to the through holes 73T1a, 73T2a, and 73T5 formed in the dielectric layer 73. Through holes 74T3 and 74T4 are connected to the conductor layers 743 and 744, respectively.

Figure 12A:
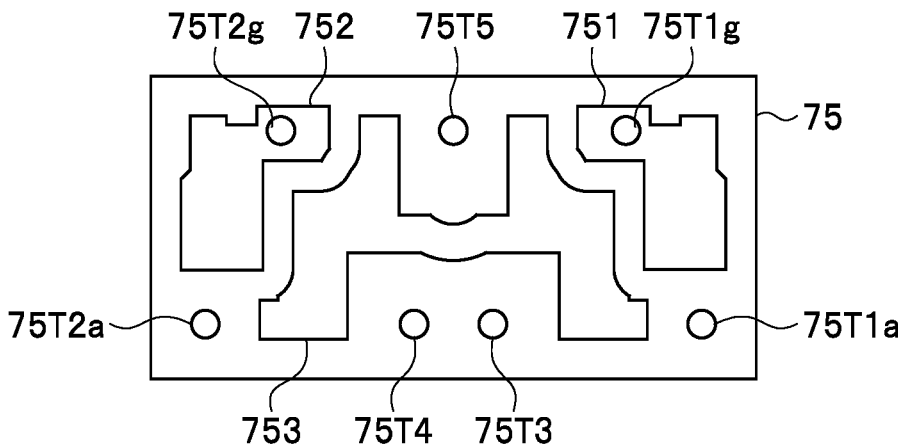
FIG. 12A is an explanatory diagram showing a patterned surface of a fifth dielectric layer of the stack of the multilayered filter device according to the second embodiment of the present invention.

FIG. 12A shows a patterned surface of the fifth dielectric layer 75. Conductor layers 751, 752, and 753 are formed on the patterned surface of the dielectric layer 75. Through holes 75T1a, 75T2a, 75T3, 75T4, and 75T5 shown in FIG. 12A are connected respectively to the through holes 74T1a, 74T2a, 74T3, 74T4, and 74T5 formed in the dielectric layer 54. Through holes 75T1g and 75T2g are connected to the conductor layers 751 and 752, respectively.

Figure 12B:
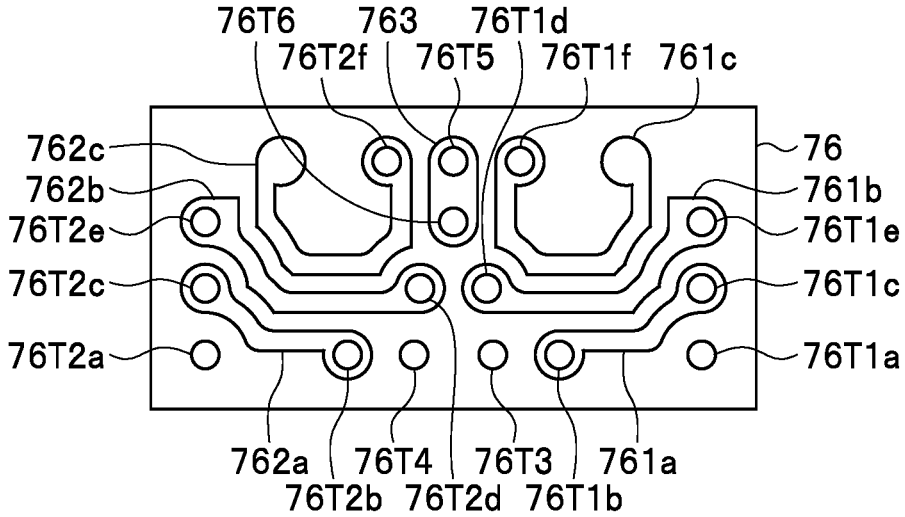
FIG. 12B is an explanatory diagram showing a patterned surface of a sixth dielectric layer of the stack of the multilayered filter device according to the second embodiment of the present invention.

FIG. 12B shows a patterned surface of the sixth dielectric layer 76. Resonator conductor layers 761a, 761b, 761c, 762a, 762b, and 762c and a conductor layer 763 are formed on the patterned surface of the dielectric layer 76. Each of the conductor layers 761a to 761c and 762a to 762c has a first end and a second end opposite to each other.

Through holes 76T1a, 76T2a, 76T3, and 76T4 shown in FIG. 12B are connected respectively to the through holes 75T1a, 75T2a, 75T3, and 75T4 formed in the dielectric layer 75.

A through hole 76T1b is connected to a portion near the first end of the conductor layer 761a. A through hole 76T1c is connected to a portion near the second end of the conductor layer 761a. A through hole 76T1d is connected to a portion near the first end of the conductor layer 761b. A through hole 76T1e is connected to a portion near the second end of the conductor layer 761b. A through hole 76T1f is connected to a portion near the first end of the conductor layer 761c. The through hole 75T1g formed in the dielectric layer 75 is connected to a portion near the second end of the conductor layer 761c.

A through hole 76T2b is connected to a portion near the first end of the conductor layer 762a. A through hole 76T2c is connected to a portion near the second end of the conductor layer 762a. A through hole 76T2d is connected to a portion near the first end of the conductor layer 762b. A through hole 76T2e is connected to a portion near the second end of the conductor layer 762b. A through hole 76T2f is connected to a portion near the first end of the conductor layer 762c. The through hole 75T2g formed in the dielectric layer 75 is connected to a portion near the second end of the conductor layer 762c.

Through holes 76T5 and 76T6 and the through hole 75T5 that is formed in the dielectric layer 75 are connected to the conductor layer 763.

Figure 12C:
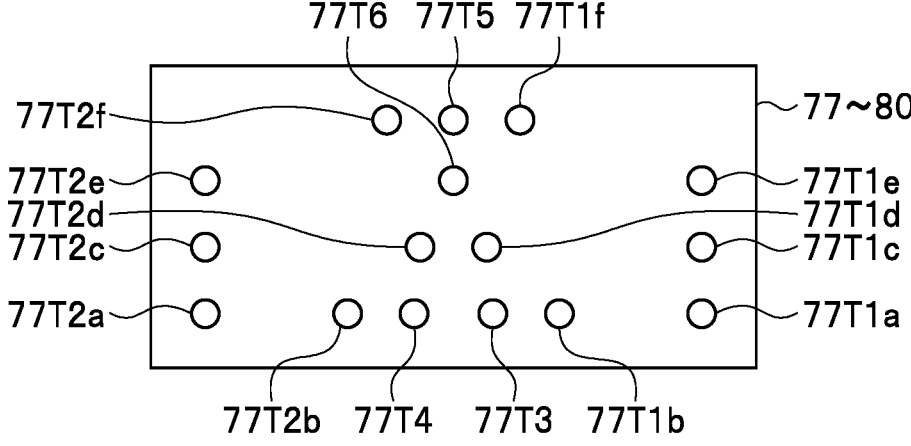
FIG. 12C is an explanatory diagram showing a patterned surface of each of seventh to tenth dielectric layers of the stack of the multilayered filter device according to the second embodiment of the present invention.

FIG. 12C shows a patterned surface of each of the seventh to tenth dielectric layers 77 to 80. Through holes 77T1a, 77T1b, 77T1c, 77T1d, 77T1e, 77T1f, 77T2a, 77T2b, 77T2c, 77T2d, 77T2e, 77T2f, 77T3, 77T4, 77T5, and 77T6 are formed in each of the dielectric layers 77 to 80. The through holes 77T1a to 77T1f, 77T2a to 77T2f, and 77T3 to 77T6 formed in the dielectric layer 77 are connected respectively to the through holes 76T1a to 76T1f, 76T2a to 76T2f, and 76T3 to 76T6 formed in the dielectric layer 76. In the dielectric layers 77 to 80, vertically adjacent through holes denoted by the same reference numerals are connected to each other.

Figure 13A:
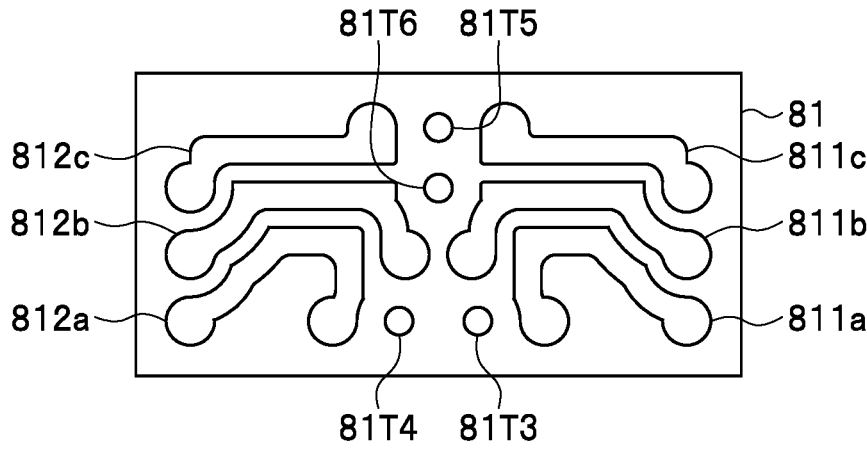
FIG. 13A to FIG. 13C are explanatory diagrams showing respective patterned surfaces of eleventh to thirteenth dielectric layers of the stack of the multilayered filter device according to the second embodiment of the present invention.

FIG. 13A shows a patterned surface of the eleventh dielectric layer 81. Resonator conductor layers 811a, 811b, 811c, 812a, 812b, and 812c are formed on the patterned surface of the dielectric layer 81. Each of the conductor layers 811a to 811c and 812a to 812c has a first end and a second end opposite to each other.

The through hole 77T1a formed in the dielectric layer 80 is connected to a portion near the first end of the conductor layer 811a. The through hole 77T1b formed in the dielectric layer 80 is connected to a portion near the second end of the conductor layer 811a. The through hole 77T1c formed in the dielectric layer 80 is connected to a portion near the first end of the conductor layer 811b. The through hole 77T1d formed in the dielectric layer 80 is connected to a portion near the second end of the conductor layer 811b. The through hole 77T1*e* formed in the dielectric layer 80 is connected to a portion near the first end of the conductor layer 811*c*. The through hole 77T1*f* formed in the dielectric layer 80 is connected to a portion near the second end of the conductor layer 811*c*.

The through hole 77T2*a* formed in the dielectric layer 80 is connected to a portion near the first end of the conductor layer 812*a*. The through hole 77T2*b* formed in the dielectric layer 80 is connected to a portion near the second end of the conductor layer 812*a*. The through hole 77T2*c* formed in the dielectric layer 80 is connected to a portion near the first end of the conductor layer 812*b*. The through hole 77T2*d* formed in the dielectric layer 80 is connected to a portion near the second end of the conductor layer 812*b*. The through hole 77T2*e* formed in the dielectric layer 80 is connected to a portion near the first end of the conductor layer 812*c*. The through hole 77T2*f* formed in the dielectric layer 80 is connected to a portion near the second end of the conductor layer 812*c*.

Through holes 81T3 to 81T6 shown in FIG. 13A are connected respectively to the through holes 77T3 to 77T6 formed in the dielectric layer 80.

Figure 13B:
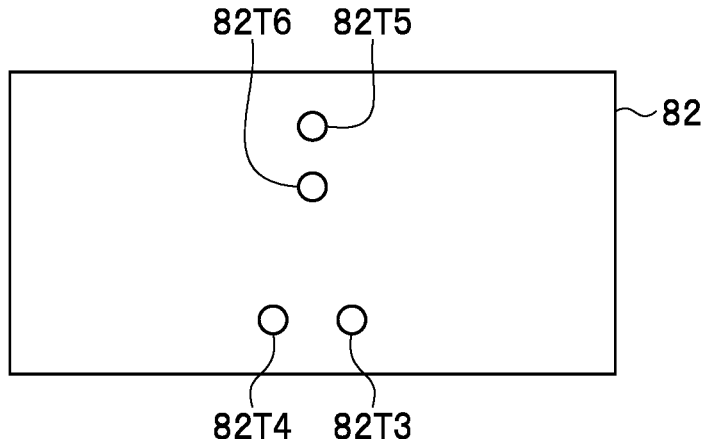

FIG. 13B shows a patterned surface of the twelfth dielectric layer 82. Through holes 82T3 to 82T6 shown in FIG. 13B are connected respectively to the through holes 81T3 to 81T6 formed in the dielectric layer 81.

Figure 13C:
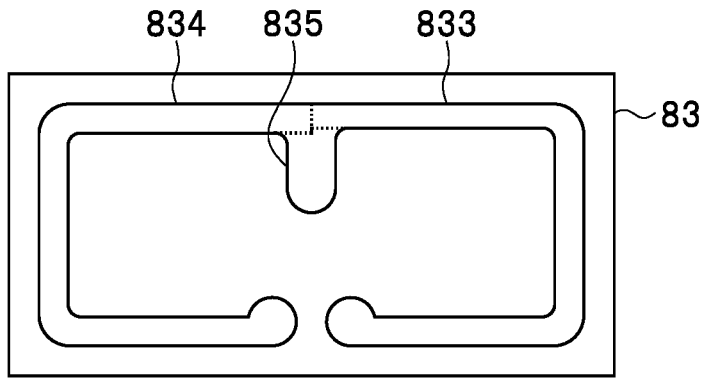

FIG. 13C shows a patterned surface of the thirteenth dielectric layer 83. Resonator conductor layers 833 and 834 and the conductor layer 835 are formed on the patterned surface of the dielectric layer 83. Each of the conductor layers 833 and 834 has a first end and a second end opposite to each other. The second end of the conductor layer 833 and the second end of the conductor layer 834 are connected to each other. The conductor layer 835 is connected to the conductor layers 833 and 834 near the boundary between the conductor layer 833 and the conductor layer 834. In FIG. 13C, each boundary between the conductor layers 833, 834, and 835 is indicated by a dotted line.

The through hole 82T3 formed in the dielectric layer 82 is connected to a portion near the first end of the conductor layer 833. The through hole 82T4 formed in the dielectric layer 82 is connected to a portion near the first end of the conductor layer 834. The through holes 82T5 and 82T6 formed in the dielectric layer 82 are connected to the conductor layer 835.

Figure 14:
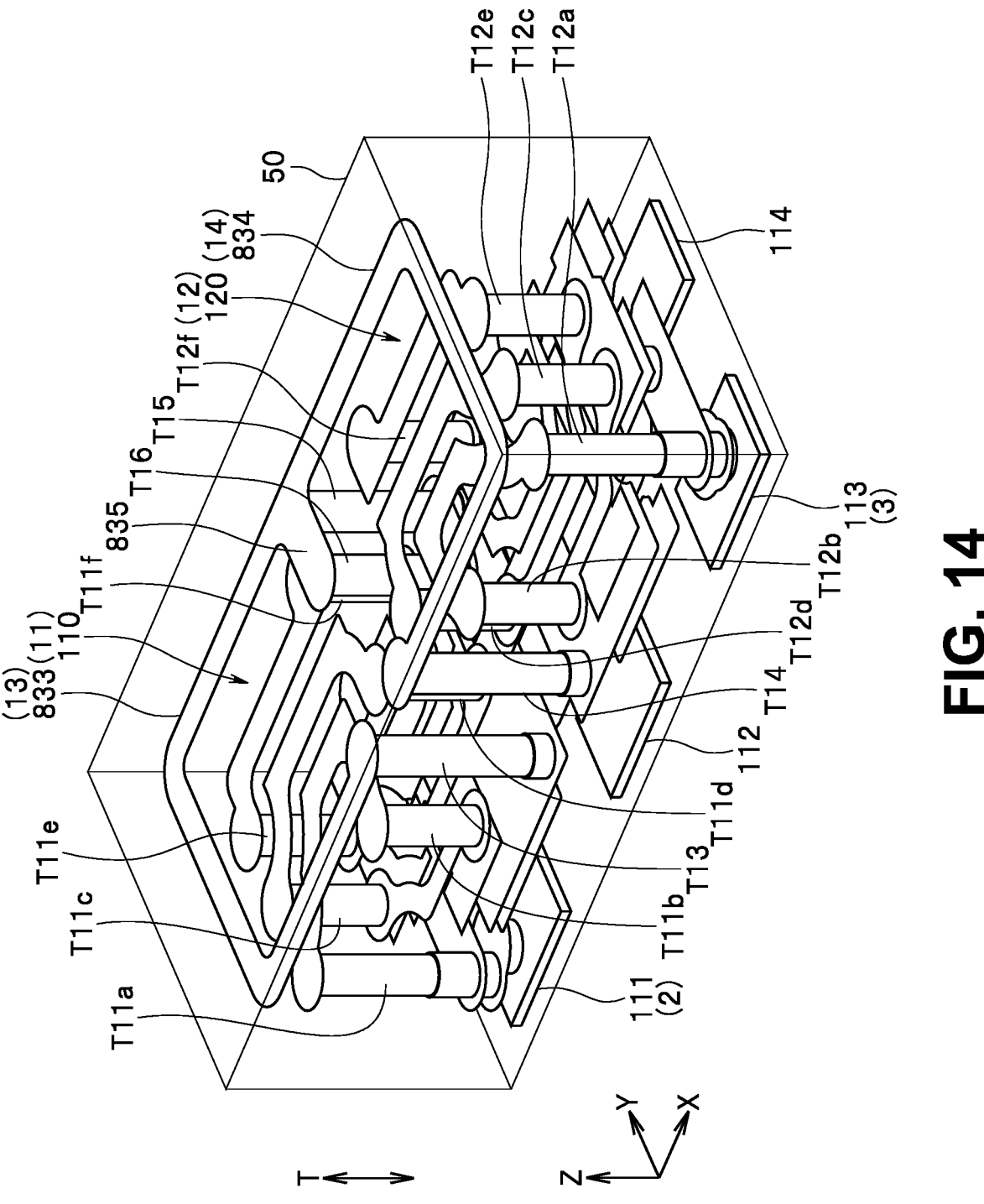
FIG. 14 is a perspective view showing an internal structure of the stack of the multilayered filter device according to the second embodiment of the present invention.

FIG. 14 shows an internal structure of the stack 50 formed by stacking the first dielectric layer 51 (refer to FIG. 3A), the second to thirteenth dielectric layers 72 to 83, and the fourteenth dielectric layer 64 (refer to FIG. 6). As shown in FIG. 14, the plurality of conductor layers and the plurality of through holes shown in FIG. 3A and FIG. 11A to FIG. 13C are stacked inside the stack 50. Note that the mark 641 (refer to FIG. 6) is omitted in FIG. 14.

Correspondences between the circuit components of the filter device 1 shown in FIG. 1 in the first embodiment and the internal components of the stack 50 shown in FIG. 11A to FIG. 13C will now be described. The first parallel resonator 11 is composed of the conductor layers 761*a* to 761*c*, 811*a* to 811*c* and the through holes 73T1*a*, 74T1*a*, 75T1*a*, 76T1*a* to 76T1*f*, and 77T1*a* to 77T1*f*.

The second parallel resonator 12 is composed of the conductor layers 762*a* to 762*c* and 812*a* to 812*c* and the through holes 73T2*a*, 74T2*a*, 75T2*a*, 76T2*a* to 76T2*f*, and 77T2*a* to 77T2*f*.

The first serial resonator 13 is composed of the conductor layer 833. The second serial resonator 14 is composed of the conductor layer 834.

The capacitor C1 is composed of the conductor layers 731 and 733. The capacitor C2 is composed of the conductor layers 732 and 734. The capacitor C3 is composed of the conductor layers 733 and 743 and the dielectric layer 73 between the conductor layers. The capacitor C4 is composed of the conductor layers 743 and 744 and the dielectric layer 73 between the conductor layers.

The capacitor C5 is composed of a pair of the conductor layers 761*b* and 762*b*, a pair of the through holes 77T1*d* and 77T2*d*, and a pair of the conductor layers 811*b* and 812*b*. The capacitor C6 is composed of the conductor layers 734 and 751 and the dielectric layer 74 between the conductor layers. The capacitor C7 is composed of the conductor layers 744 and 752 and the dielectric layer 74 between the conductor layers. The capacitor C8 is composed of the conductor layers 735, 743, 744, and 753 and the dielectric layers 73 and 74 between the conductor layers.

The capacitor C11 is composed of the conductor layers 541 and 551 and the dielectric layer 54 between the conductor layers. The capacitor C12 is composed of the conductor layers 542 and 552 and the dielectric layer 54 between the conductor layers.

Figure 15:
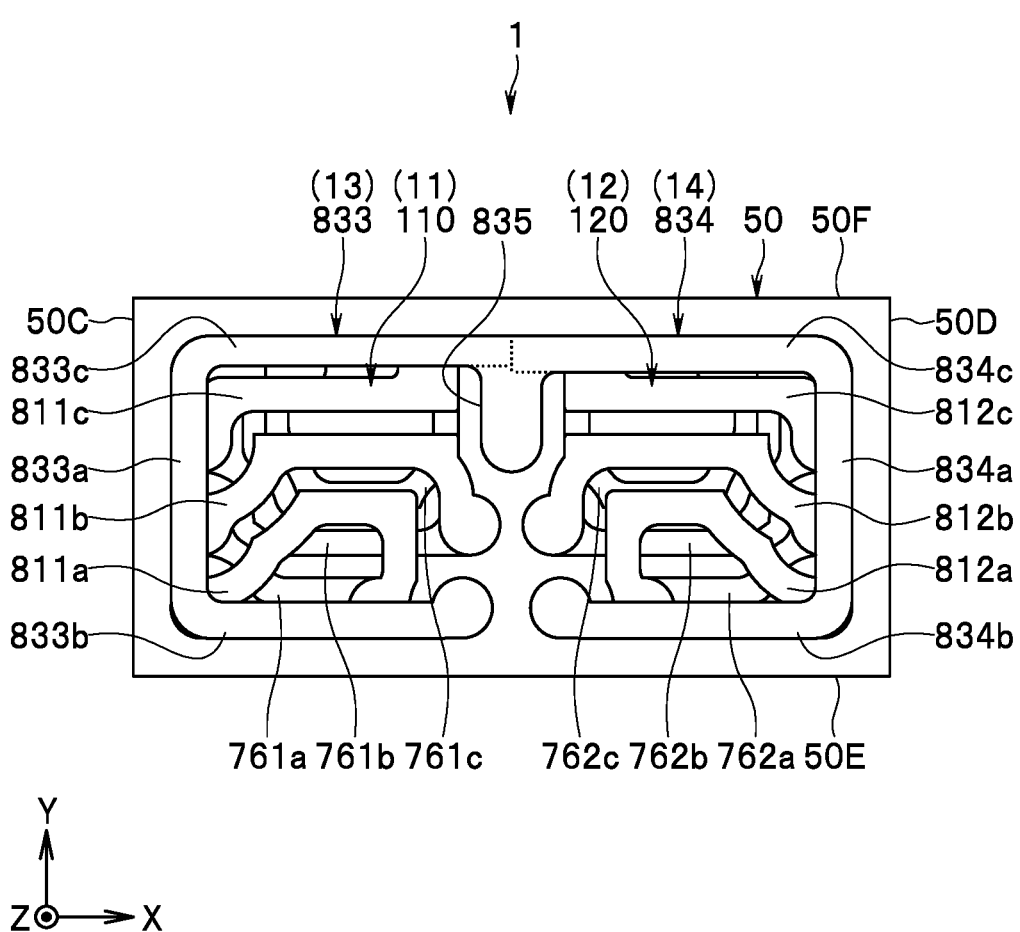
FIG. 15 is a plan view showing part of an internal structure of the stack shown in FIG. 14.

Next, the structural features of the filter device 1 according to the present embodiment will be described with reference to FIG. 2 and FIG. 11A to FIG. 15. FIG. 15 is a plan view showing part of an internal structure of the stack 50 shown in FIG. 14.

First, features of the first parallel resonator 11 will be described. In the present embodiment, the plurality of conductor layers and the plurality of through holes constituting the conductor structure 110 of the first parallel resonator 11 are different from those in the first embodiment. In the present embodiment, the conductor structure 110 includes through hole lines T11*a*, T11*b*, T11*c*, T11*d*, T11*e*, and T11*f* and the conductor layers 761*a* to 761*c* and 811*a* to 811*c*.

The through hole line T11*a* is formed with the through holes 73T1*a*, 74T1*a*, 75T1*a*, 76T1*a*, and 77T1*a* being connected in series. The through hole line T11*b* is formed with the through holes 76T1*b* and 77T1*b* being connected in series. The through hole line T11*c* is formed with the through holes 76T1*c* and 77T1*c* being connected in series. The through hole line T11*d* is formed with the through holes 76T1*d* and 77T1*d* being connected in series. The through hole line T11*e* is formed with the through holes 76T1*e* and 77T1*e* being connected in series. The through hole line T11*f* is formed with the through holes 76T1*f*, 77T1*f*, and 62T1*f* being connected in series.

The conductor layer 761*c* has a first end and a second end located at both ends of the conductor layer 761*c* in a longitudinal direction. The conductor layer 761*c* includes a portion closer to the side surface 50E than the first end and the second end are.

The conductor layer 761*a* is electrically connected to one end of each of the through hole lines T11*b* and T11*c*. The conductor layer 761*b* is electrically connected to one end of each of the through hole lines T11*d* and T11*e*. The conductor layer 761*c* is electrically connected to one end of the through hole line T11*f*. The conductor layer 761*c* is electrically connected to the conductor layer 751 via the through hole 75T1*g*.

Each of the conductor layers 811*a* and 811*b* has a first end and a second end located at both ends of the corresponding one of the conductor layers 811*a* and 811*b* in a longitudinal direction. Each of the conductor layers 811*a* and 811*b* includes a portion closer to the side surface 50F than the first end and the second end of the corresponding one of the conductor layers 811*a* and 811*b* are. A large part of the conductor layer 811*c* extends in a direction parallel to the X direction.

The conductor layer 811*a* is electrically connected to one end of the through hole line T11*a* and the other end of the through hole line T11*b*. The conductor layer 811*b* is electrically connected to the other end of each of the through hole lines T11*c* and T11*d*. The conductor layer 811*c* is electrically connected to the other end of each of the through hole lines T11*e* and T11*f.*

The through hole lines T11*a* to T11*f* and the conductor layers 761*a* to 761*c* and 811*a* to 811*c* are connected in the order of the through hole line T11*a*, the conductor layer 811*a*, the through hole line T11*b*, the conductor layer 761*a*, the through hole line T11*c*, the conductor layer 811*b*, the through hole line T11*d*, the conductor layer 761*b*, the through hole line T11*e*, the conductor layer 811*c*, the through hole line T11*f*, and the conductor layer 761*c* to encircle an axis parallel to the Y direction.

Next, features of the second parallel resonator 12 will be described. In the present embodiment, the plurality of conductor layers and the plurality of through holes constituting the conductor structure 120 of the second parallel resonator 12 are different from those in the first embodiment. In the present embodiment, the conductor structure 120 includes through hole lines T12*a*, T12*b*, T12*c*, T12*d*, T12*e*, and T12*f* and the conductor layers 762*a* to 762*c* and 812*a* to 812*c*.

By substituting the through hole lines T12*a* to T12*f*, the through holes 73T2*a*, 74T2*a*, 75T2*a*, 76T2*a* to 76T2*f*, and 77T2*a* to 77T2*f*, and the conductor layers 752, 762*a* to 762*c*, and 812*a* to 812*c* respectively for the through hole lines T11*a* to T11*f*, the through holes 73T1*a*, 74T1*a*, 75T1*a*, 75T1*g*, 76T1*a* to 76T1*f*, and 77T1*a* to 77T1*f*, and the conductor layers 751, 761*a* to 761*c*, and 811*a* to 811*c* in the description of the structure of the conductor structure 110 in the present embodiment, this serves as a description of a structure of the conductor structure 120 in the present embodiment.

Note that the positional relationship between the first parallel resonator 11 and the second parallel resonator 12 in the present embodiment and the posture of each of the first and second parallel resonators 11 and 12 are similar to those in the first embodiment.

Next, features of the first and the second serial resonators 13 and 14 in the present embodiment will be described. The shape of the conductor layer 833 constituting the first serial resonator 13 is similar to the shape of the conductor layer 633 in the first embodiment. The shape of the conductor layer 834 constituting the second serial resonator 14 is similar to the shape of the conductor layer 634 in the first embodiment. The positional relationship between the first serial resonator 13 and the second serial resonator 14 and the posture of each of the first and second serial resonators 13 and 14 are similar to those in the first embodiment.

The conductor layer 833 is electrically connected to the conductor layer 743 via the through hole line T13. The through hole line T13 is formed with the through holes 74T3, 75T3, 76T3, and 77T3 being connected in series.

The conductor layer 834 is electrically connected to the conductor layer 744 via the through hole line T14. The through hole line T14 is formed with the through holes 74T4, 75T4, 76T4, and 77T4 being connected in series.

Each of the conductor layers 833 and 834 is electrically connected to the through hole lines T15 and T16 via the conductor layer 835. The through hole line T15 is formed with the through holes 76T5, 77T5, 81T5, and 82T5 being connected in series. The through hole line T16 is formed with the through holes 76T6, 77T6, 81T6, and 82T6 being connected in series. The through hole lines T15 and T16 are electrically connected to the electrode 115 (refer to FIG. 2 and FIG. 3A) via the through hole 51T5 (refer to FIG. 3A), the conductor layer 721, the through holes 72T5, 73T5, 74T5, and 75T5, and the conductor layer 763.

Next, structural features of the filter device 1 according to the present embodiment will be described by focusing on the first parallel resonator 11 and the first serial resonator 13. In the present embodiment, the conductor layer 833 of the first serial resonator 13 includes three portions 833*a*, 833*b*, and 833*c* each located between a corresponding one of the side surfaces 50C, 50E, and 50F and at least part of the conductor structure 110 when seen in the stacking direction T. In the present embodiment in particular, the portion 833*a* is arranged between the side surface 50C and part of each of the conductor layers 811*a* to 811*c* when seen in the stacking direction T. The portion 833*b* is arranged between the side surface 50E and each of part of the conductor layer 811*a* and the conductor layers 811*b* and 811*c* when seen in the stacking direction T. The portion 833*c* is arranged between the side surface 50F and each of the conductor layers 811*a* and 811*b* and part of the conductor layer 811*c* when seen in the stacking direction T.

The conductor layer 833 overlaps the conductor structure 110 when seen in the stacking direction T. In the present embodiment in particular, the conductor layer 833 overlaps part of each of the conductor layers 761*a* to 761*c* and 811*a* to 811*c* and the through hole lines T11*a*, T11*c*, and T11*e*. The conductor layer 833 and the conductor layers 811*a* to 811*c* are arranged at positions different from each other in the stacking direction T.

Next, structural features of the filter device 1 according to the present embodiment will be described by focusing on the second parallel resonator 12 and the second serial resonator 14 in the present embodiment. In the present embodiment, the conductor layer 834 of the second serial resonator 14 includes three portions 834*a*, 834*b*, and 834*c* each located between a corresponding one of the side surfaces 50D, 50E, and 50F and at least part of the conductor structure 120 when seen in the stacking direction T. In the present embodiment in particular, the portion 834*a* is arranged between the side surface 50D and part of each of the conductor layers 812*a* to 812*c*. The portion 834*b* is arranged between the side surface 50E and each of part of the conductor layer 812*a* and the conductor layers 812*b* and 812*c* when seen in the stacking direction T. The portion 834*c* is arranged between the side surface 50F and each of the conductor layers 812*a* and 812*b* and part of the conductor layer 812*c* when seen in the stacking direction T.

The conductor layer 834 overlaps the conductor structure 120 when seen in the stacking direction T. In the present embodiment in particular, the conductor layer 834 overlaps part of each of the conductor layers 762*a* to 762*c* and 812*a* to 812*c* and the through hole lines T12*a*, T12*c*, and T12*e* forming the conductor structure 120. The conductor layer 834 and the conductor layers 812*a* to 812*c* are arranged at positions different from each other in the stacking direction T.

Figure 16:
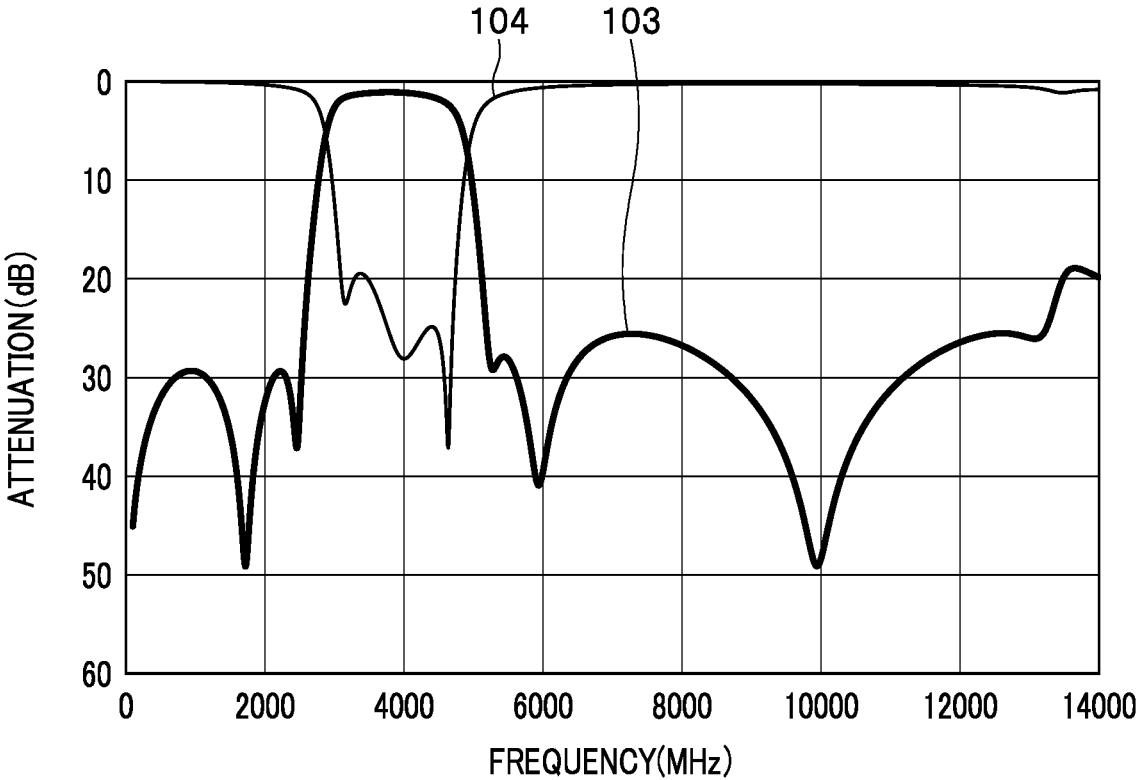
FIG. 16 is a characteristic chart showing an example of characteristics of the multilayered filter device according to the second embodiment of the present invention.

Next, an example of characteristics of the filter device 1 according to the present embodiment will be described. FIG. 16 shows an example of pass attenuation characteristics and return attenuation characteristics of the filter device 1. In FIG. 16, the horizontal axis represents frequency, and the vertical axis represents attenuation. In FIG. 16, a curve denoted by a reference numeral 103 represents the pass attenuation characteristics of the filter device 1. A curve denoted by a reference numeral 104 represents the return attenuation characteristics in the first terminal 2.

The configuration, operation, and effects of the present embodiment are otherwise the same as those of the first embodiment.

Third Embodiment

Figure 17:
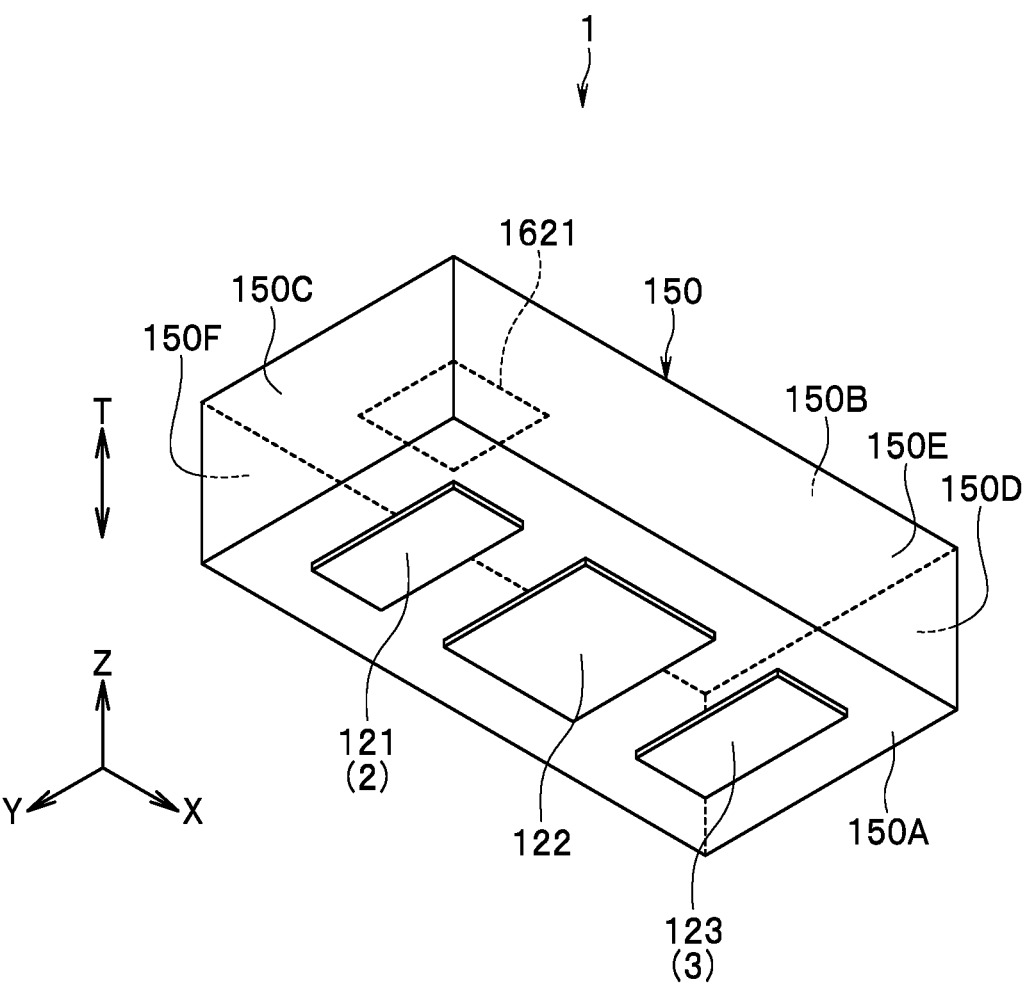
FIG. 17 is a perspective view showing an external appearance of a multilayered filter device according to a third embodiment of the present invention.

Next, a third embodiment of the present invention will be described. First, with reference to FIG. 17, the filter device 1 according to the present embodiment will be described in differences from the first embodiment. FIG. 17 is a perspective view showing an external appearance of the filter device 1 according to the present embodiment.

The filter device 1 according to the present embodiment includes a stack 150 instead of the stack 50 in the first embodiment. The stack 150 includes a plurality of dielectric layers and a plurality of conductors stacked together. The first terminal 2, the second terminal 3, the plurality of resonators, and the capacitors C1 to C7, C11, and C12 shown in FIG. 1 in the first embodiment are integrated with the stack 150.

The stack 150 has a first surface 150A and a second surface 150B located at both ends in the stacking direction T of the plurality of dielectric layers, and four side surfaces 150C to 150F connecting the first surface 150A and the second surface 150B. The side surfaces 150C and 150D are opposite to each other. The side surfaces 150E and 150F are opposite to each other. The side surfaces 150C to 150F are perpendicular to the first surface 150A and the second surface 150B.

As shown in FIG. 17, the first surface 150A is located at the end of the stack 150 in the −Z direction. The first surface 150A also serves as the bottom surface of the stack 150. The second surface 150B is located at the end of the stack 150 in the Z direction. The second surface 150B also serves as the top surface of the stack 150. The shape of each of the first surface 150A and the second surface 150B is a rectangular shape being long in the X direction. The side surface 150C is located at the end of the stack 150 in the −X direction. The side surface 150D is located at the end of the stack 150 in the X direction. The side surface 150E is located at the end of the stack 150 in the −Y direction. The side surface 150F is located at the end of the stack 150 in the Y direction.

The filter device 1 includes electrodes 121, 122, and 123 arranged on the first surface 150A of the stack 150 instead of the electrodes 111 to 116 in the first embodiment. The electrodes 121, 122, and 123 are arranged in this order in the X direction. The electrode 121 corresponds to the first terminal 2. The electrode 123 corresponds to the second terminal 3. The electrode 122 is connected to the ground.

Next, an example of a plurality of dielectric layers, a plurality of conductor layers, and a plurality of through holes constituting the stack 150 will be described with reference to FIG. 18A to FIG. 21B. In this example, the stack 150 includes twelve dielectric layers stacked together. The twelve dielectric layers will be referred to below as first to twelfth dielectric layers in the order from bottom to top. The first to twelfth dielectric layers are denoted by reference numerals 151 to 162, respectively.

In FIG. 18A to FIG. 20C, each of a plurality of circles represents a through hole. The dielectric layers 151 to 160 each have a plurality of through holes. In FIG. 18A to FIG. 20C, a plurality of specific through holes among the plurality of through holes are denoted by reference numerals. For a connection relationship between each of the plurality of specific through holes and an electrode, a conductor layer, or another through hole, the connection relationship in a state where the first to twelfth dielectric layers 151 to 162 are stacked together is described.

Figure 18A:
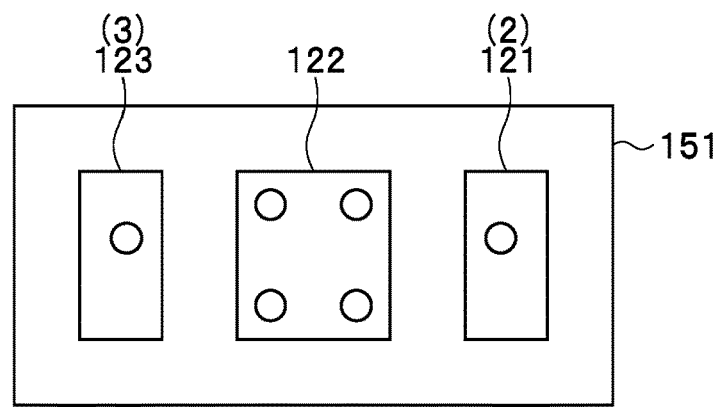
FIG. 18A to FIG. 18C are explanatory diagrams showing respective patterned surfaces of first to third dielectric layers of a stack of the multilayered filter device according to the third embodiment of the present invention.

FIG. 18A shows a patterned surface of the first dielectric layer 151. The electrodes 121 to 123 are formed on the patterned surface of the dielectric layer 151.

Figure 18B:
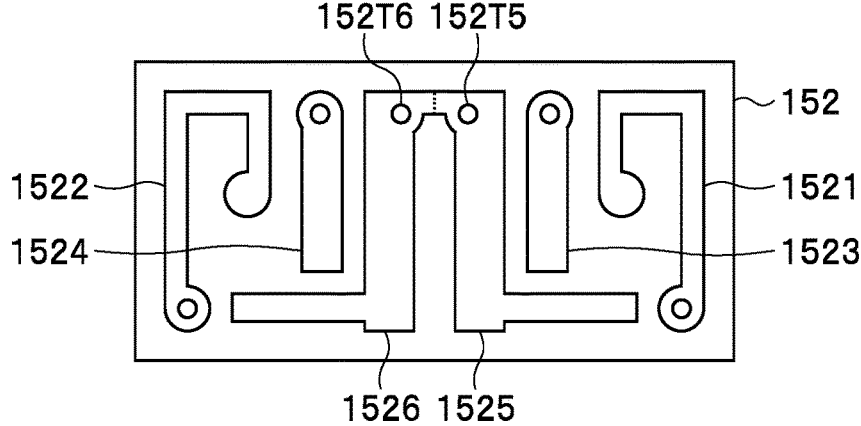

FIG. 18B shows a patterned surface of the second dielectric layer 152. Conductor layers 1521, 1522, 1523, 1524, 1525, and 1526 are formed on the patterned surface of the dielectric layer 152. The conductor layer 1526 is connected to the conductor layer 1525. In FIG. 18B, the boundary between the conductor layer 1525 and the conductor layer 1526 is indicated by a dotted line.

The through holes 152T5 and 152T6 shown in FIG. 18B are connected to the conductor layers 1525 and 1526, respectively.

Figure 18C:
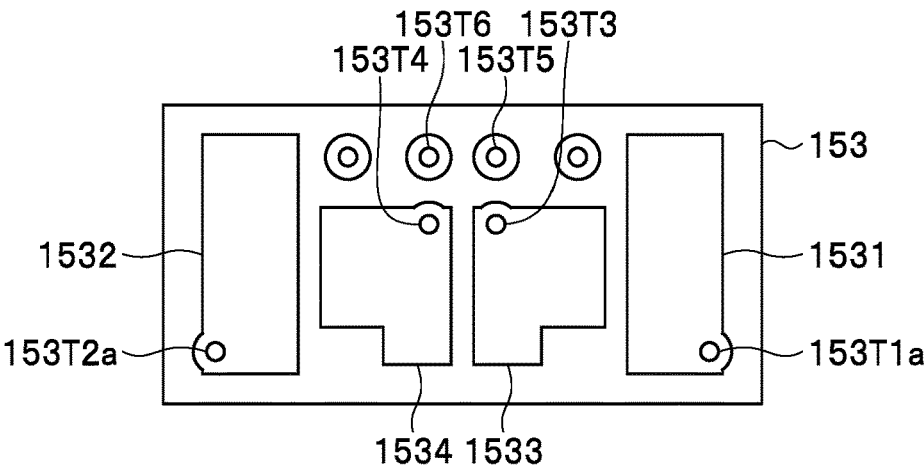

FIG. 18C shows a patterned surface of the third dielectric layer 153. Conductor layers 1531, 1532, 1533, and 1534 are formed on the patterned surface of the dielectric layer 153. Through holes 153T1a, 153T2a, 153T3, and 153T4 shown in FIG. 18C are connected to the conductor layers 1531, 1532, 1533, and 1534, respectively. The through holes 153T5 and 153T6 are connected respectively to the through holes 152T5 and 152T6 formed in the dielectric layer 152.

Figure 19A:
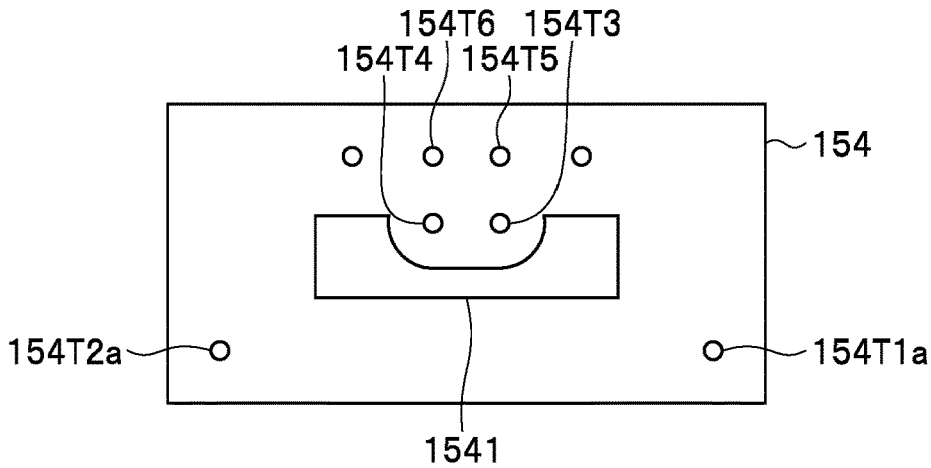
FIG. 19A to FIG. 19C are explanatory diagrams showing respective patterned surfaces of fourth to sixth dielectric layers of the stack of the multilayered filter device according to the third embodiment of the present invention.

FIG. 19A shows a patterned surface of the fourth dielectric layer 154. A conductor layer 1541 is formed on the patterned surface of the dielectric layer 154. Through holes 154T1a, 154T2a, 154T3, 154T4, 154T5, and 154T6 shown in FIG. 19A are connected respectively to the through holes 153T1a, 153T2a, 153T3, 153T4, 153T5, and 153T6 formed in the dielectric layer 153.

Figure 19B:
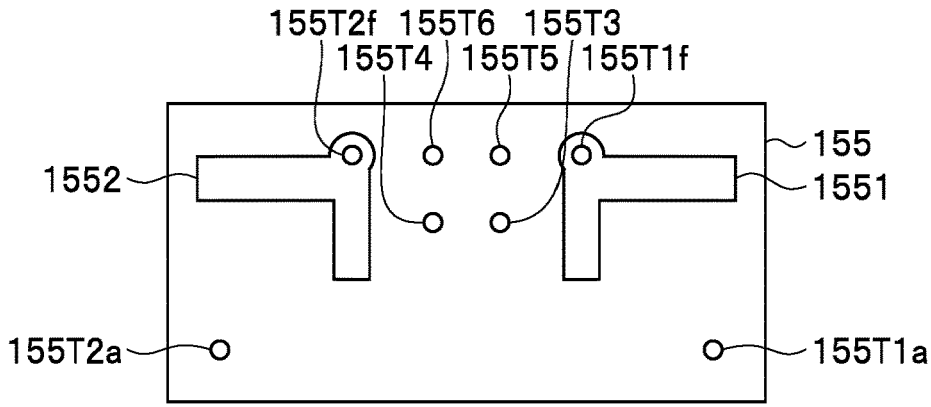

FIG. 19B shows a patterned surface of the fifth dielectric layer 155. Conductor layers 1551 and 1552 are formed on the patterned surface of the dielectric layer 155. Through holes 155T1a, 155T2a, 155T3, 155T4, 155T5, and 155T6 shown in FIG. 19B are connected respectively to the through holes 154T1a, 154T2a, 154T3, 154T4, 154T5, and 154T6 formed in the dielectric layer 154. The through holes 155T1f and 155T2f are connected to the conductor layers 1551 and 1552, respectively.

Figure 19C:
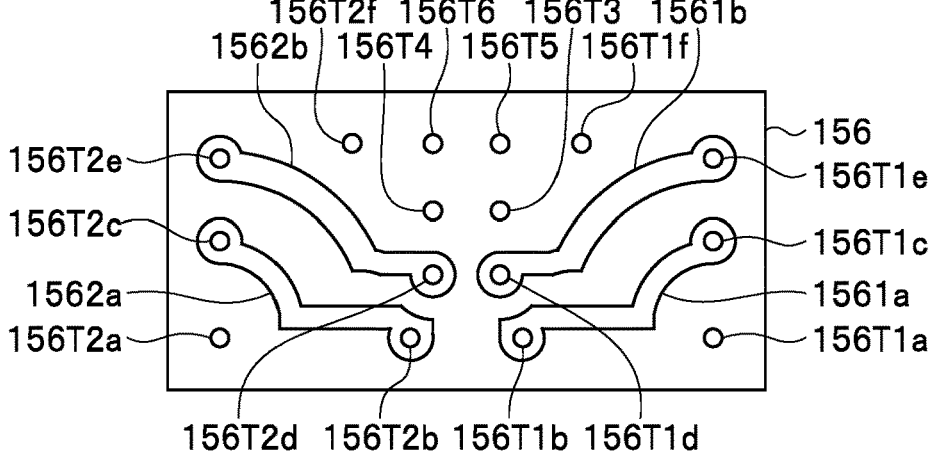

FIG. 19C shows a patterned surface of the sixth dielectric layer 156. Resonator conductor layers 1561a, 1561b, 1562a, and 1562b are formed on the patterned surface of the dielectric layer 156. Each of the conductor layers 1561a, 1561b, 1562a, and 1562b has a first end and a second end opposite to each other.

Through holes 156T1a, 156T1f, 156T2a, 156T2f, 156T3, 156T4, 156T5, and 156T6 shown in FIG. 19C are connected respectively to the through holes 155T1a, 155T1f, 155T2a, 155T2f, 155T3, 155T4, 155T5, and 155T6 formed in the dielectric layer 155.

A through hole 156T1b is connected to a portion near the first end of the conductor layer 1561a. A through hole 156T1c is connected to a portion near the second end of the conductor layer 1561a. A through hole 156T1d is connected to a portion near the first end of the conductor layer 1561b. A through hole 156T1e is connected to a portion near the second end of the conductor layer 1561b.

A through hole 156T2b is connected to a portion near the first end of the conductor layer 1562a. A through hole 156T2c is connected to a portion near the second end of the conductor layer 1562a. A through hole 156T2d is connected to a portion near the first end of the conductor layer 1562b. A through hole 156T2e is connected to a portion near the second end of the conductor layer 1562b.

Figure 20A:
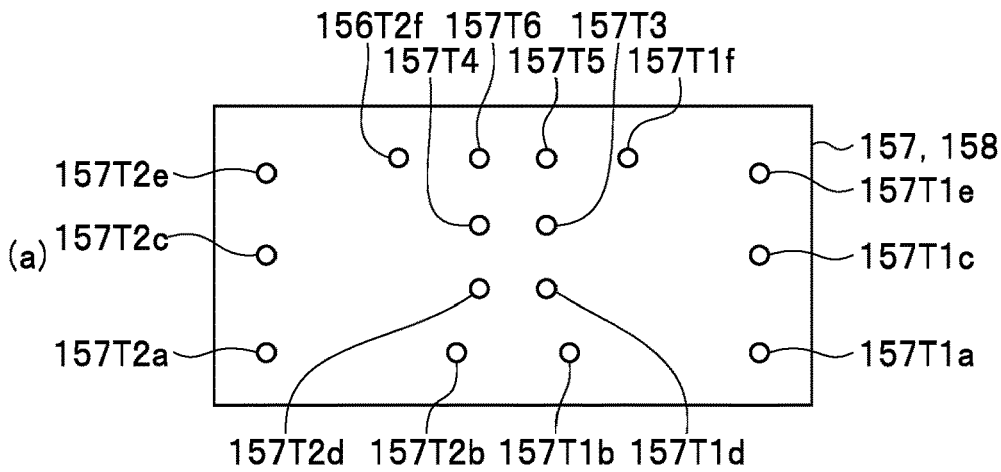
FIG. 20A is an explanatory diagram showing a patterned surface of each of seventh and eighth dielectric layers of the stack of the multilayered filter device according to the third embodiment of the present invention.

FIG. 20A shows a patterned surface of each of the seventh and eighth dielectric layers 157 and 158. Through holes 157T1*a*, 157T1*b*, 157T1*c*, 157T1*d*, 157T1*e*, 157T1*f*, 157T2*a*, 157T2*b*, 157T2*c*, 157T2*d*, 157T2*e*, 157T2*f*, 157T3, 157T4, 157T5, and 157T6 are formed in each of the dielectric layers 157 and 158. The through holes 157T1*a* to 157T1*f*, 157T2*a* to 157T2*f*, and 157T3 to 157T6 formed in the dielectric layer 157 are connected respectively to the through holes 156T1*a* to 156T1*f*, 156T2*a* to 156T2*f*, and 156T3 to 156T6 formed in the dielectric layer 156. In the dielectric layers 157 and 158, vertically adjacent through holes denoted by the same reference numerals are connected to each other.

Figure 20B:
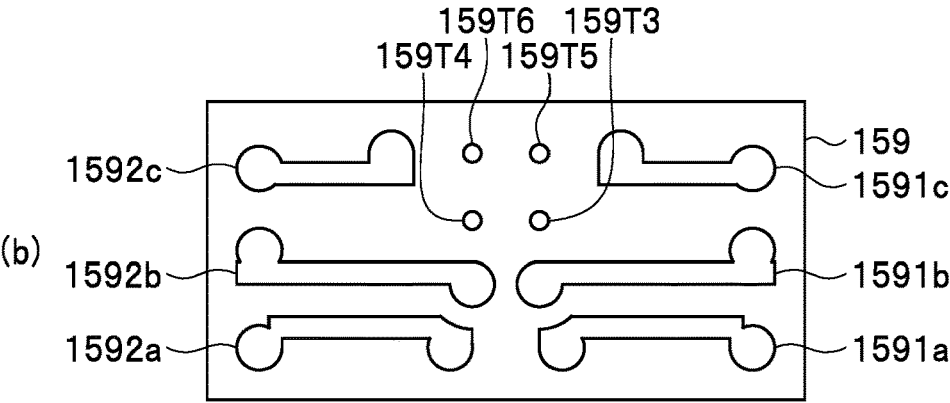
FIG. 20B is an explanatory diagram showing a patterned surface of a ninth dielectric layer of the stack of the multilayered filter device according to the third embodiment of the present invention.

FIG. 20B shows a patterned surface of the ninth dielectric layer 159. Resonator conductor layers 1591*a*, 1591*b*, 1591*c*, 1592*a*, 1592*b*, and 1592*c* are formed on the patterned surface of the dielectric layer 159. Each of the conductor layers 1591*a* to 1591*c* and 1592*a* to 1592*c* has a first end and a second end opposite to each other.

The through hole 157T1*a* formed in the dielectric layer 158 is connected to a portion near the first end of the conductor layer 1591*a*. The through hole 157T1*b* formed in the dielectric layer 158 is connected to a portion near the second end of the conductor layer 1591*a*. The through hole 157T1*c* formed in the dielectric layer 158 is connected to a portion near the first end of the conductor layer 1591*b*. The through hole 157T1*d* formed in the dielectric layer 158 is connected to a portion near the second end of the conductor layer 1591*b*. The through hole 157T1*d* formed in the dielectric layer 158 is connected to a portion near the first end of the conductor layer 1591*c*. The through hole 157T1*e* formed in the dielectric layer 158 is connected to a portion near the second end of the conductor layer 1591*c*.

The through hole 157T2*a* formed in the dielectric layer 158 is connected to a portion near the first end of the conductor layer 1592*a*. The through hole 157T2*b* formed in the dielectric layer 158 is connected to a portion near the second end of the conductor layer 1592*a*. The through hole 157T2*c* formed in the dielectric layer 158 is connected to a portion near the first end of the conductor layer 1592*b*. The through hole 157T2*d* formed in the dielectric layer 158 is connected to a portion near the second end of the conductor layer 1592*b*. The through hole 157T2*d* formed in the dielectric layer 158 is connected to a portion near the first end of the conductor layer 1592*c*. The through hole 157T2*e* formed in the dielectric layer 158 is connected to a portion near the second end of the conductor layer 1592*c*.

The through holes 159T3 to 159T6 are connected respectively to the through holes 157T3 to 157T6 formed in the dielectric layer 158.

Figure 20C:
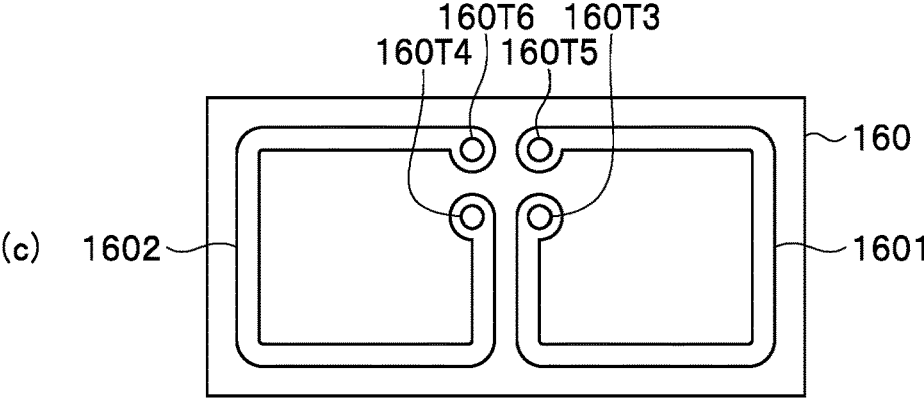
FIG. 20C is an explanatory diagram showing a patterned surface of a tenth dielectric layer of the stack of the multilayered filter device according to the third embodiment of the present invention.

FIG. 20C shows a patterned surface of the tenth dielectric layer 160. Resonator conductor layers 1601 and 1602 are formed on the patterned surface of the dielectric layer 160. Each of the conductor layers 1601 and 1602 has a first end and a second end opposite to each other.

A through hole 160T3 shown in FIG. 20C and the through hole 159T3 formed in the dielectric layer 159 are connected to a portion near the first end of the conductor layer 1601. A through hole 160T4 and the through hole 159T4 that is formed in the dielectric layer 159 are connected to a portion near the first end of the conductor layer 1602. A through hole 160T5 and the through hole 159T5 that is formed in the dielectric layer 159 are connected to a portion near the second end of the conductor layer 1601. A through hole 160T6 and the through hole 159T6 that is formed in the dielectric layer 159 are connected to a portion near the second end of the conductor layer 1602.

Figure 21A:
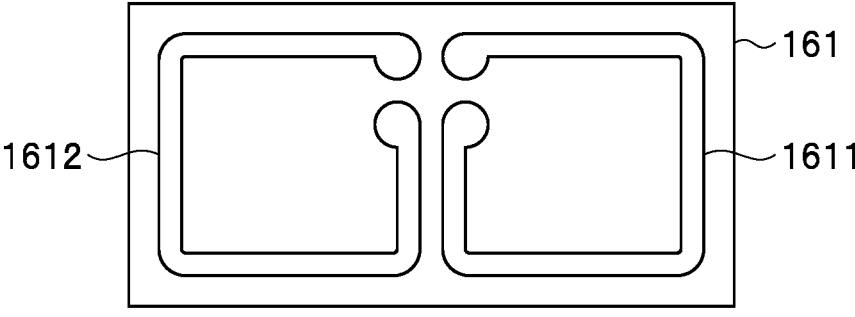
FIG. 21A and FIG. 21B are explanatory diagrams showing respective patterned surfaces of eleventh and twelfth dielectric layers of the stack of the multilayered filter device according to the third embodiment of the present invention.

FIG. 21A shows a patterned surface of the eleventh dielectric layer 161. Resonator conductor layers 1611 and 1612 are formed on the patterned surface of the dielectric layer 161. Each of the conductor layers 1611 and 1612 has a first end and a second end opposite to each other.

The through hole 160T3 formed in the dielectric layer 160 is connected to a portion near the first end of the conductor layer 1611. The through hole 160T4 formed in the dielectric layer 160 is connected to a portion near the first end of the conductor layer 1612. The through hole 160T5 formed in the dielectric layer 160 is connected to a portion near the second end of the conductor layer 1611. The through hole 160T6 formed in the dielectric layer 160 is connected to a portion near the second end of the conductor layer 1612.

Figure 21B:
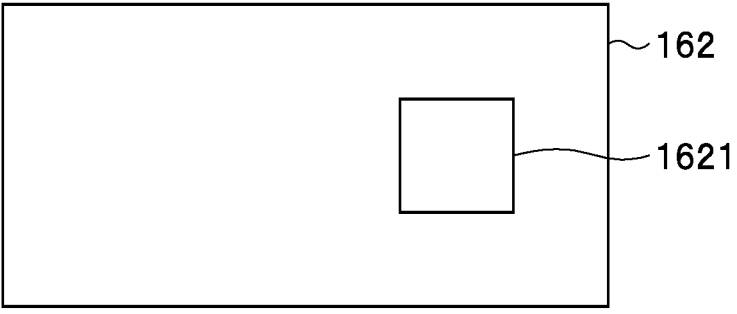

FIG. 21B shows a patterned surface of the twelfth dielectric layer 162. A mark 1621 is formed on the patterned surface of the dielectric layer 162.

The stack 150 shown in FIG. 17 is formed by stacking the first to twelfth dielectric layers 151 to 162 such that the patterned surface of the first dielectric layer 151 serves as the first surface 150A of the stack 150 and the surface of the twelfth dielectric layer 162 opposite to the patterned surface thereof serves as the second surface 150B of the stack 150.

Figure 22:
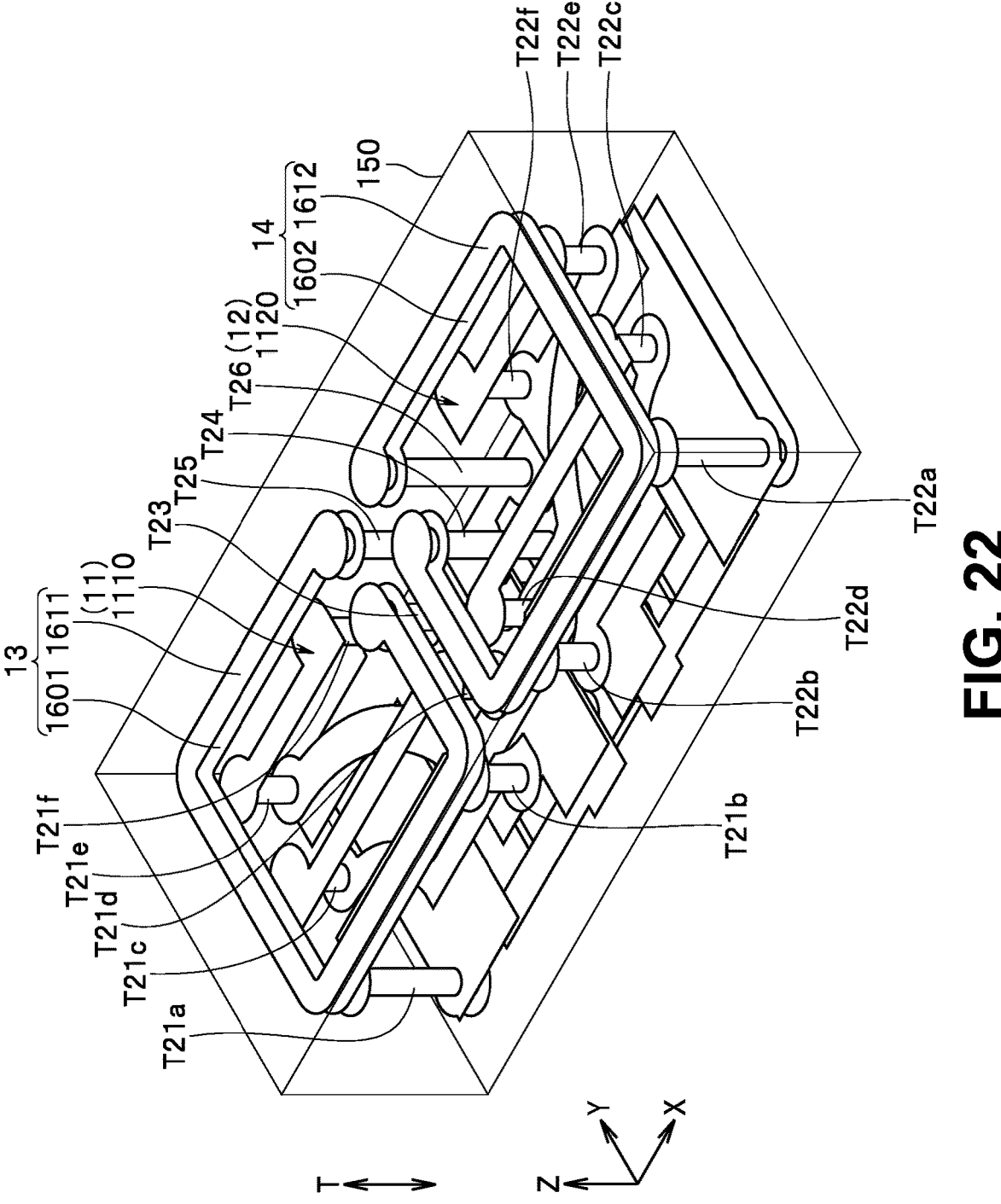
FIG. 22 is a perspective view showing an internal structure of the stack of the multilayered filter device according to the third embodiment of the present invention.

FIG. 22 shows the internal structure of the stack 150 formed by stacking the first to twelfth dielectric layers 151 to 162. As shown in FIG. 22, the plurality of conductor layers and the plurality of through holes shown in FIG. 18A to FIG. 21A are stacked inside the stack 150. Note that the mark 1621 is omitted in FIG. 22.

Correspondences between the circuit components of the filter device 1 shown in FIG. 1 in the first embodiment and the internal components of the stack 150 shown in FIG. 18A to FIG. 21A will now be described. The first parallel resonator 11 is composed of the conductor layers 1561*a*, 1561*b*, 1591*a* to 1591*c* and the through holes 153T1*a*, 154T1*a*, 155T1*a*, 155T1*f*, 156T1*a* to 156T1*f*, and 157T1*a* to 157T1*f*.

The second parallel resonator 12 is composed of the conductor layers 1562*a*, 1562*b*, and 1592*a* to 1592*c* and the through holes 153T2*a*, 154T2*a*, 155T2*a*, 155T2*f*, 156T2*a* to 156T2*f*, and 157T2*a* to 157T2*f*.

The first serial resonator 13 is composed of the conductor layers 1601 and 1611 and the through holes 160T3 and 160T5. The second serial resonator 14 is composed of the conductor layers 1602 and 1612 and the through holes 160T4 and 160T6.

The capacitor C1 is composed of the conductor layers 1523 and 1525. The capacitor C2 is composed of the conductor layers 1524 and 1526. The capacitor C3 is composed of the conductor layers 1525 and 1533 and the dielectric layer 152 between the conductor layers. The capacitor C4 is composed of the conductor layers 1526 and 1534 and the dielectric layer 152 between the conductor layers.

The capacitor C5 is composed of the conductor layers 1541, 1551, and 1552 and the dielectric layer 154 between the conductor layers. The capacitor C6 is composed of the conductor layers 1525 and 1533 and the dielectric layer 74 between the conductor layers. The capacitor C7 is composed of the conductor layers 1524 and 1534 and the dielectric layer 152 between the conductor layers. The capacitor C8 is composed of the conductor layers 1533, 1534, and 1541 and the dielectric layer 153 between the conductor layers.

The capacitor C11 is composed of the conductor layers 1531 and 1551 and the dielectric layers 153 and 154 between the conductor layers. The capacitor C12 is composed of the conductor layers 1532 and 1552 and the dielectric layers 153 and 154 between the conductor layers.

Figure 23:
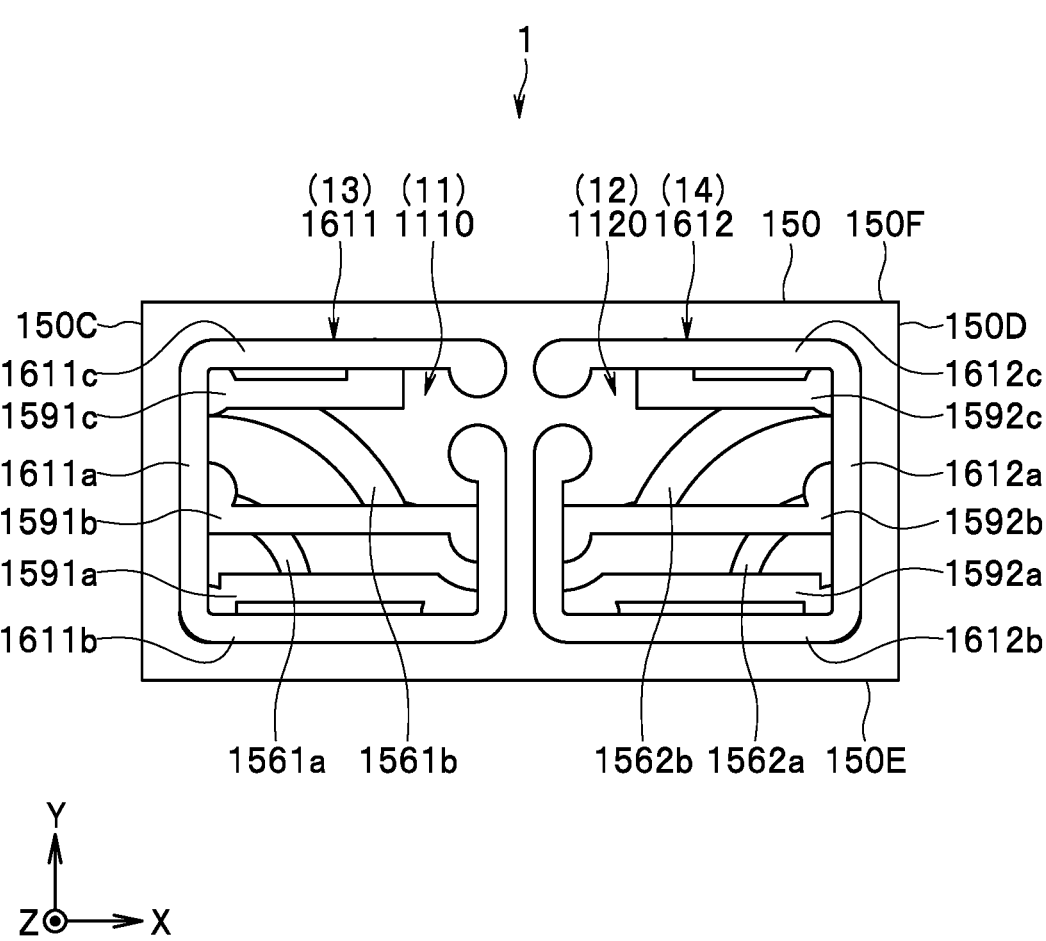
FIG. 23 is a plan view showing part of an internal structure of the stack shown in FIG. 22.

Next, the structural features of the filter device 1 according to the present embodiment will be described with reference to FIG. 17 to FIG. 23. FIG. 23 is a plan view showing part of an internal structure of the stack 150 shown in FIG. 22.

First, features of the first parallel resonator 11 will be described. The first parallel resonator 11 includes a conductor structure 1110 instead of the conductor structure 110 in the first embodiment. The conductor structure 1110 is wound around an axis extending in a direction orthogonal to the stacking direction T. In the present embodiment in particular, the conductor structure 1110 is wound 1¼ times around an axis extending in a direction parallel to the Y direction.

The conductor structure 1110 includes through hole lines T21*a*, T21*b*, T21*c*, T21*d*, T21*e*, and T21*f* and the conductor layers 1561*a*, 1561*b*, 1591*a*, 1591*b*, and 1591*c*.

The through hole line T21*a* is formed with the through holes 153T1*a*, 154T1*a*, 155T1*a*, 156T1*a*, and 157T1*a* being connected in series. The through hole line T21*b* is formed with the through holes 156T1*b* and 157T1*b* being connected in series. The through hole line T21*c* is formed with the through holes 156T1*c* and 157T1*c* being connected in series. The through hole line T21*d* is formed with the through holes 156T1*d* and 157T1*d* being connected in series. The through hole line T21*e* is formed with the through holes 156T1*e* and 157T1*e* being connected in series. The through hole line T21*f* is formed with the through holes 155T1*f*, 156T1*f*, and 157T1*f* being connected in series.

The conductor layer 1561*a* is electrically connected to one end of each of the through hole lines T21*b* and T21*c*. The conductor layer 1561*b* is electrically connected to one end of each of the through hole lines T21*d* and T21*e*.

A large part of each of the conductor layers 1591*a* to 1591*c* extends in a direction parallel to the X direction. The conductor layer 1591*a* is electrically connected to one end of the through hole line T21*a* and the other end of the through hole line T21*b*. The conductor layer 1591*b* is electrically connected to the other end of each of the through hole lines T21*c* and T21*d*. The conductor layer 1591*c* is electrically connected to the other end of the through hole line T21*e* and one end of the through hole line T21*f*.

The through hole lines T21*a* to T21*f* and the conductor layers 1561*a*, 1561*b*, and 1591*a* to 1591*c* are connected in the order of the through hole line T21*a*, the conductor layer 1591*a*, the through hole line T21*b*, the conductor layer 1561*a*, the through hole line T21*c*, the conductor layer 1591*b*, the through hole line T21*d*, the conductor layer 1561*b*, the through hole line T21*e*, the conductor layer 1591*c*, and the through hole line T21*f* to encircle an axis parallel to the Y direction.

Next, features of the second parallel resonator 12 will be described. The second parallel resonator 12 includes a conductor structure 1120 instead of the conductor structure 120 in the first embodiment. The conductor structure 1120 is wound around an axis extending in a direction orthogonal to the stacking direction T. In the present embodiment in particular, the conductor structure 1120 is wound 1¼ times around an axis extending in a direction parallel to the Y direction.

The conductor structure 1120 includes through hole lines T22*a*, T22*b*, T22*c*, T22*d*, T22*e*, and T22*f* and the conductor layers 1562*a*, 1562*b*, 1592*a*, 1592*b*, and 1592*c*.

By substituting the through hole lines T22*a* to T22*f*, the through holes 153T2*a*, 154T2*a*, 155T2*a*, 155T2*f*, 156T2*a* to 156T2*f*, and 157T2*a* to 157T2*f*, and the conductor layers 1562*a*, 1562*b*, and 1592*a* to 1592*c* respectively for the through hole lines T21*a* to T21*f*, the through holes 153T1*a*,

154T1*a*, 155T1*a*, 155T1*f*, 156T1*a* to 156T1*f*, and 157T1*a* to 157T1*f*, and the conductor layers 1561*a*, 1561*b*, and 1591*a* to 1591*c* in the description of the structure of the conductor structure 1110, this serves as a description of a structure of the conductor structure 1120.

Note that the positional relationship between the first parallel resonator 11 and the second parallel resonator 12 in the present embodiment and the posture of each of the first and second parallel resonators 11 and 12 are similar to those in the first embodiment.

Next, features of the first and the second serial resonators 13 and 14 in the present embodiment will be described. The conductor layers 1601 and 1611 forming the first serial resonator 13 are each wound around an axis extending in the direction parallel to the stacking direction T. In the present embodiment in particular, the conductor layers 1601 and 1611 are each wound once around an axis extending in the direction parallel to the Z direction.

The conductor layers 1601 and 1611 are connected to each other via the through holes 160T3 and 160T5. The conductor layer 1601 is electrically connected to the conductor layer 1533 via the through hole line T23 and is also electrically connected to the conductor layer 1525 via the through hole line T25. The conductor layer 1525 is electrically connected to the electrode 122 via two through holes (refer to FIG. 18A and FIG. 18B). The through hole line T23 is formed with the through holes 153T3, 154T3, 155T3, 156T3, and 157T3 being connected in series. The through hole line T25 is formed with the through holes 152T5, 153T5, 154T5, 155T5, 156T5, and 157T5 being connected in series.

The conductor layers 1602 and 1612 forming the second serial resonator 14 are each wound around an axis extending in the direction parallel to the stacking direction T. In the present embodiment in particular, the conductor layers 1602 and 1612 are each wound once around an axis extending in the direction parallel to the Z direction.

The conductor layers 1602 and 1612 are connected to each other via the through holes 160T4 and 160T6. The conductor layer 1602 is electrically connected to the conductor layer 1534 via the through hole line T24 and is also electrically connected to the conductor layer 1526 via the through hole line T26. The conductor layer 1526 is electrically connected to the electrode 122 via two through holes (refer to FIG. 18A and FIG. 18B). The through hole line T24 is formed with the through holes 153T4, 154T4, 155T4, 156T4, and 157T4 being connected in series. The through hole line T26 is formed with the through holes 152T6, 153T6, 154T6, 155T6, 156T6, and 157T6 being connected in series.

Next, structural features of the filter device 1 according to the present embodiment will be described by focusing on the first parallel resonator 11 and the first serial resonator 13. In the present embodiment, each of the conductor layers 1601 and 1611 of the first serial resonator 13 includes three portions each located between a corresponding one of the side surfaces 150C, 150E, and 150F and at least part of the conductor structure 1110 when seen in the stacking direction T. In FIG. 23, the three portions of the conductor layer 1611 are denoted by reference numerals 1611*a*, 1611*b*, and 1611*c*, respectively. In the present embodiment in particular, the portion 1611*a* is arranged between the side surface 150C and each of the conductor layers 1591*a* to 1591*c* when seen in the stacking direction T. The portion 1611*b* is arranged between the side surface 150E and each of part of the conductor layer 1591*a* and the conductor layers 1591*b* and 1591*c* when seen in the stacking direction T. The portion 1611*c* is arranged between the side surface 150F and each of the conductor layers 1591*a* and 1591*b* and part of the conductor layer 1591*c* when seen in the stacking direction T.

Each of the conductor layers 1601 and 1611 overlaps the conductor structure 1110 when seen in the stacking direction T. The conductor layers 1601 and 1611 and the conductor layers 1591*a* to 1591*c* are arranged at positions different from each other in the stacking direction T.

Next, structural features of the filter device 1 according to the present embodiment will be described by focusing on the second parallel resonator 12 and the second serial resonator 14. In the present embodiment, each of the conductor layers 1602 and 1612 of the second serial resonator 14 includes three portions each located between a corresponding one of the side surfaces 150D, 150E, and 150F and at least part of the conductor structure 1120 when seen in the stacking direction T. In FIG. 23, the three portions of the conductor layer 1612 are denoted by reference numerals 1612*a*, 1612*b*, and 1612*c*, respectively. In the present embodiment in particular, the portion 1612*a* is arranged between the side surface 150D and part of each of the conductor layers 1592*a* to 1592*c* when seen in the stacking direction T. The portion 1612*b* is arranged between the side surface 150E and each of part of the conductor layer 1592*a* and the conductor layers 1592*b* and 1592*c* when seen in the stacking direction T. The portion 1612*c* is arranged between the side surface 150F and each of the conductor layers 1592*a* and 1592*b* and part of the conductor layer 1592*c* when seen in the stacking direction T.

Each of the conductor layers 1602 and 1612 overlaps the conductor structure 1120 when seen in the stacking direction T. The conductor layers 1602 and 1612 and the conductor layers 1592*a* to 1592*c* are arranged at positions different from each other in the stacking direction T.

Next, structural features of the filter device 1 according to the present embodiment will be described by focusing on the first serial resonator 13 and the second serial resonator 14. The conductor layers 1601 and 1611 of the first serial resonator 13 and the conductor layers 1602 and 1612 of the second serial resonator 14 are arranged in the longitudinal direction (direction parallel to the X direction) of the plane shape, in other words, the first surface 150A or the second surface 150B, of the stack 150 when seen in the stacking direction T.

A first gap is formed between both ends of the conductor layer 1601 in the longitudinal direction, in other words, the first end and the second end of the conductor layer 1601. A second gap is formed between both ends of the conductor layer 1602 in the longitudinal direction, in other words, the first end and the second end of the conductor layer 1602. The first gap and the second gap are adjacent to each other in the direction orthogonal to the stacking direction T, in other words, the direction parallel to the X direction.

A third gap is formed between both ends of the conductor layer 1611 in the longitudinal direction, in other words, the first end and the second end of the conductor layer 1611. A fourth gap is formed between both ends of the conductor layer 1612 in the longitudinal direction, in other words, the first end and the second end of the conductor layer 1612. The third gap and the fourth gap are adjacent to each other in the direction orthogonal to the stacking direction T, in other words, the direction parallel to the X direction. The first gap and the third gap are adjacent to each other in the stacking direction T. The second gap and the fourth gap are adjacent to each other in the stacking direction T.

Figure 24:
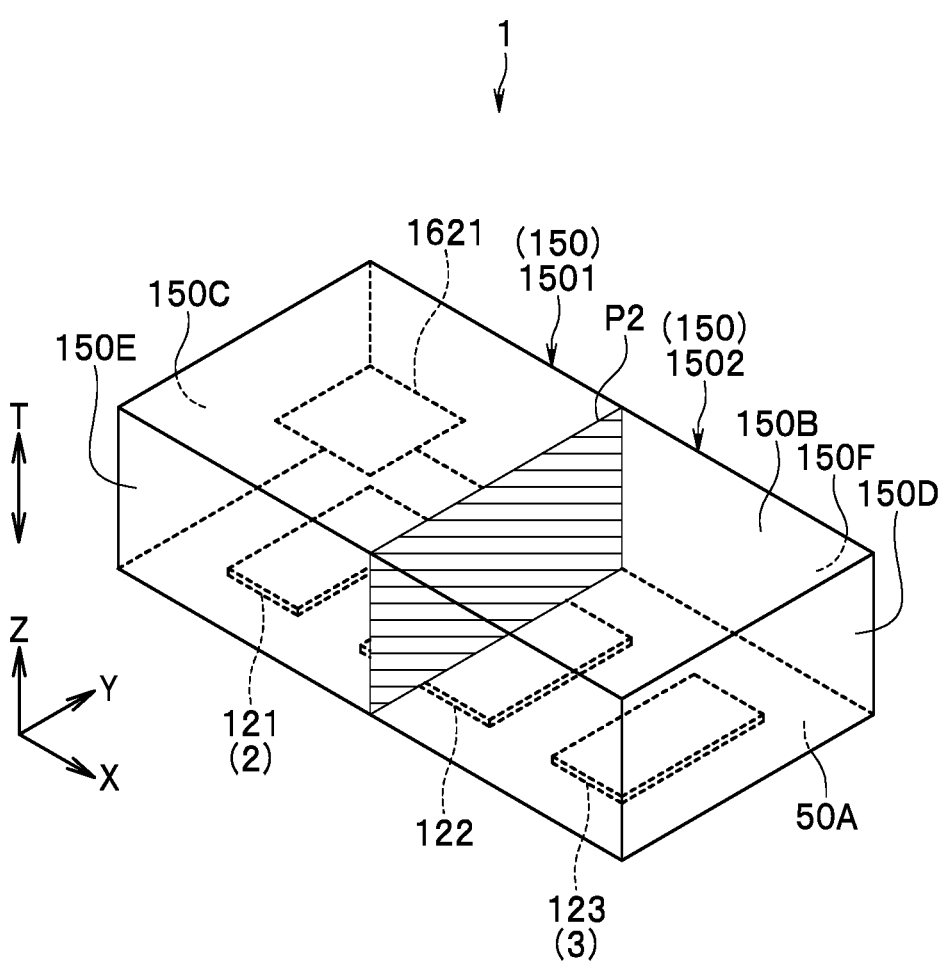
FIG. 24 is an explanatory diagram for describing a virtual plane in the third embodiment of the present invention.

Next, features of the plurality of conductors included in the stack 150 will be described. Here, a virtual plane P2 parallel to the stacking direction T will be defined. FIG. 24 is an explanatory diagram for describing the virtual plane P2. In the present embodiment in particular, the virtual plane P2 is a YZ plane intersecting the center of the first surface 150A or the second surface 150B in the longitudinal direction. Note that, in FIG. 24, for convenience, the virtual plane P2 is hatched. A portion of the stack 150 on a side surface 150C side with respect to the virtual plane P2 is referred to as a first portion 1501. A portion of the stack 150 on a side surface 150D side with respect to the virtual plane P2 is referred to as a second portion 1502.

A plurality of conductors (electrodes, plurality of conductor layers, and plurality of through holes) composing the part including the first terminal 2, the first parallel resonator 11, and the first serial resonator 13 in the stack 150 are referred to as a first conductor group. The first conductor group is arranged in the first portion 1501.

A plurality of conductors (electrodes, plurality of conductor layers, and plurality of through holes) constituting the part including the second terminal 3, the second parallel resonator 12, and the second serial resonator 14 in the stack 150 are referred to as a second conductor group. The second conductor group is arranged in the second portion 1502.

The first conductor group is formed to be symmetrical to the second conductor group with the virtual plane P2 as the center. In other words, each of the plurality of conductors included in the first conductor group is formed to be symmetrical to a corresponding conductor of the plurality of conductors included in the second conductor group with the virtual plane P2 as the center.

The first conductor group may further include at least part of the plurality of conductor layers composing the capacitors C1, C3, C6, and C11, and the second conductor group may further include at least part of the plurality of conductor layers composing the capacitors C2, C4, C7, and C12.

Figure 25:
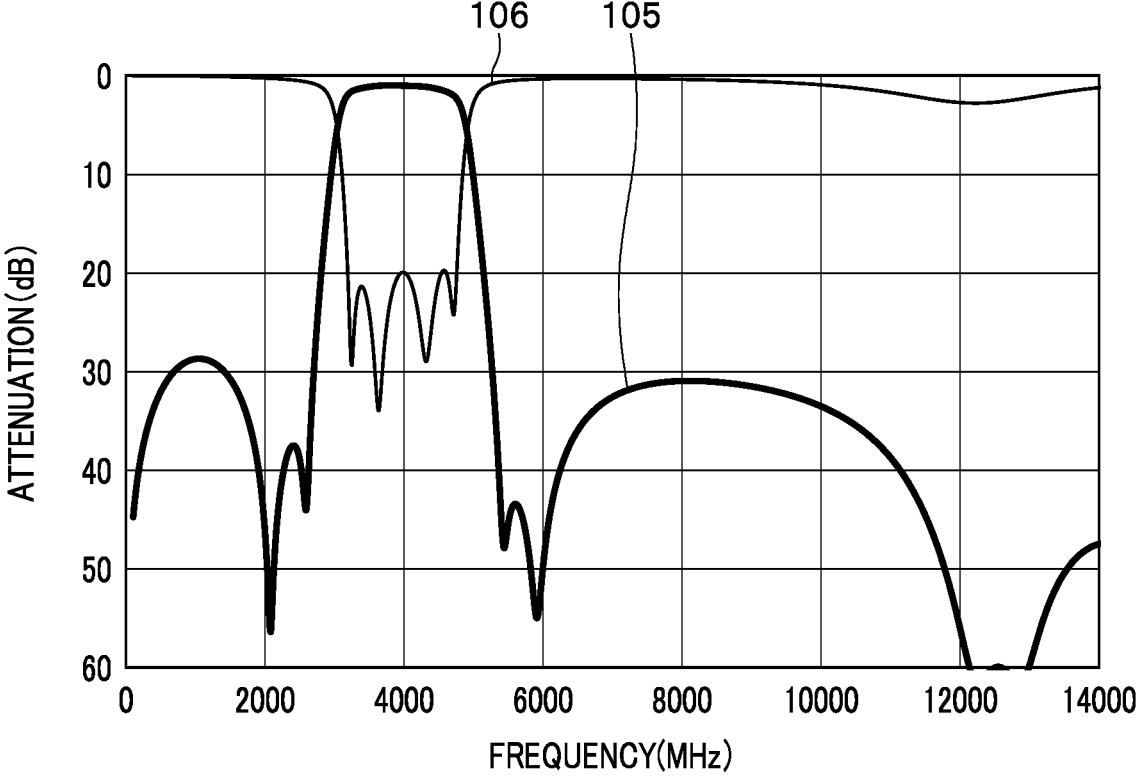
FIG. 25 is a characteristic chart showing an example of characteristics of the multilayered filter device according to the third embodiment of the present invention.

Next, an example of characteristics of the filter device 1 according to the present embodiment will be described. FIG. 25 shows an example of pass attenuation characteristics and return attenuation characteristics of the filter device 1. In FIG. 25, the horizontal axis represents frequency, and the vertical axis represents attenuation. In FIG. 25, a curve denoted by a reference numeral 105 represents the pass attenuation characteristics of the filter device 1. A curve denoted by a reference numeral 106 represents the return attenuation characteristics in the first terminal 2.

The configuration, operation, and effects of the present embodiment are otherwise the same as those of the first embodiment.

The present invention is not limited to the foregoing embodiments, and various modifications may be made thereto. For example, the number of parallel resonators and the number of serial resonators, the number of windings of each parallel resonator (conductor structure), and the number of windings of each serial resonator (conductor layer) are not limited to the examples described in each embodiment and are any. By forming each serial resonator by using a plurality of conductor layers formed on respective different patterned surfaces of dielectric layers, the number of windings of the serial resonator can be larger than one.

As described above, a multilayered filter device according to the present invention includes a first terminal, a second terminal, a plurality of resonators arranged between the first terminal and the second terminal in a circuit configuration, and a stack for integrating the first terminal, the second terminal, and the plurality of resonators, the stack including a plurality of dielectric layers stacked together. The plurality of resonators include at least one parallel resonator having both ends connected to a path connecting the first terminal and the second terminal and at least one serial resonator having only one end connected to the path. The at least one parallel resonator includes a conductor structure wound around an axis extending in a direction orthogonal to a stacking direction of a plurality of dielectric layers. The at least one serial resonator includes a first conductor layer wound around an axis extending in a direction parallel to the stacking direction. The stack has a first surface and a second surface located at both ends in the stacking direction, and four side surfaces connecting the first surface and the second surface. The first conductor layer includes three portions each located between a corresponding one of three side surfaces of the four side surfaces and at least part of the conductor structure when seen in the stacking direction.

In the multilayered filter device according to the present invention, the number of windings of the conductor structure may be ¾ or more. In the multilayered filter device according to the present invention, the number of windings of the first conductor layer may be ¾ or more.

In the multilayered filter device according to the present invention, the at least one parallel resonator may be connected to the first terminal or the second terminal.

In the multilayered filter device according to the present invention, the first conductor layer may overlap the conductor structure when seen in the stacking direction.

In the multilayered filter device according to the present invention, the conductor structure may include two through hole lines and a second conductor layer electrically connected to one end of each of the two through hole lines. Each of the two through hole lines is constituted by a plurality of through holes being connected in series. The first conductor layer and the second conductor layer may be arranged at the same position in the stacking direction. Alternatively, the first conductor layer and the second conductor layer may be arranged at different positions in the stacking direction.

When the conductor structure includes the two through hole lines and the second conductor layer, the four side surfaces may include a first side surface and a second side surface arranged at both ends in a direction orthogonal to the stacking direction. The second conductor layer may include a first end and a second end located at both ends of the second conductor layer in a longitudinal direction and also include a portion closer to the first side surface than the first end and the second end are. The conductor structure may further include a third conductor layer electrically connected to the other end of one of the two through hole lines at a position different from a position of the second conductor layer in the stacking direction. The third conductor layer may include a first end and a second end located at both ends of the third conductor layer in a longitudinal direction and also include a portion closer to the first side surface than the first end and the second end are.

In the multilayered filter device according to the present invention, the at least one parallel resonator may include a first parallel resonator and a second parallel resonator. The at least one serial resonator may include a first serial resonator and a second serial resonator. The first parallel resonator may be arranged between the first terminal and the first serial resonator in the circuit configuration. The second parallel resonator may be arranged between the second terminal and the second serial resonator in the circuit configuration. In this case, the multilayered filter device according to the present invention may further include a through hole electrically connected to a first conductor layer of the first serial resonator and a first conductor layer of the second serial resonator.

A first gap may be formed between both ends of the first conductor layer of the first serial resonator in a longitudinal direction. A second gap may be formed between both ends of the first conductor layer of the second serial resonator in a longitudinal direction. The first gap and the second gap may be adjacent to each other in a direction orthogonal to the stacking direction.

The conductor structure of the first parallel resonator may be wound to form a first opening surrounded by the conductor structure. The conductor structure of the second parallel resonator may be wound to form a second opening surrounded by the conductor structure. The conductor structure of the first parallel resonator and the conductor structure of the second parallel resonator may be arranged in the longitudinal direction of the plane shape of the stack when seen in the stacking direction, to prevent the first opening and the second opening from facing each other.

A part including the first terminal, the first parallel resonator, and the first serial resonator in the circuit configuration and a part including the second terminal, the second parallel resonator, and the second serial resonator in the circuit configuration may have circuit configurations symmetrical to each other. A plurality of conductors composing a part including the first terminal, the first parallel resonator, and the first serial resonator in the stack may be formed to be symmetrical to a plurality of conductors constituting a part including the second terminal, the second parallel resonator, and the second serial resonator in the stack, with respect to a virtual plane parallel to the stacking direction.

Obviously, many modifications and variations of the present invention are possible in the light of the above teachings. Thus, it is to be understood that, within the scope of the appended claims and equivalents thereof, the present invention may be practiced in other embodiments than the foregoing most preferable embodiments.

What is claimed is:

1. A multilayered filter device comprising:
   a first terminal;
   a second terminal;
   a plurality of resonators arranged between the first terminal and the second terminal in a circuit configuration; and
   a stack for integrating the first terminal, the second terminal, and the plurality of resonators, the stack including a plurality of dielectric layers stacked together, wherein
   the plurality of resonators include:
   at least one parallel resonator having one end not connected to a ground, and another end connected to a path connecting the first terminal and the second terminal without being routed through the ground, and
   at least one serial resonator, only one end of which is connected to the path, and another end of which is connected to the ground,
   the at least one serial resonator includes a first conductor layer wound around an axis extending in a direction parallel to a stacking direction of the plurality of dielectric layers,
   the at least one parallel resonator includes a conductor structure wound around an axis extending in a direction orthogonal to the stacking direction of the plurality of dielectric layers, the conductor structure includes two through hole lines and a second conductor layer electrically connected to one end of each of the two through hole lines, and each of the two through hole lines is constituted by a plurality of through holes being connected in series, the stack includes a first surface located at a first end in the stacking direction and a second surface located at a second end in the stacking direction and four side surfaces connecting the first surface and the second surface, and the first conductor layer includes three portions each located between a corresponding one of three side surfaces of the four side surfaces and at least part of the conductor structure when seen in the stacking direction.

2. The multilayered filter device according to claim 1, wherein the number of times the conductor structure is wound around the axis extending in the direction orthogonal to the stacking direction is a winding and wherein the number of windings of the conductor structure is three-fourths or more, around the axis extending in the direction orthogonal to the stacking direction.

3. The multilayered filter device according to claim 1, wherein the number of times the first conductor layer is wound around the axis extending in a direction parallel to the stacking direction is a winding and wherein the number of windings of the first conductor layer is three-fourths or more, around the axis extending in the direction parallel to the stacking direction.

4. The multilayered filter device according to claim 1, wherein the at least one parallel resonator includes a first parallel resonator connected to the first terminal and a second parallel resonator connected to the second terminal.

5. The multilayered filter device according to claim 1, wherein the first conductor layer overlaps the conductor structure when seen in the stacking direction.

6. The multilayered filter device according to claim 1, wherein the two through hole lines and the second conductor layer are connected in an order of one of the two through hole lines, the second conductor layer, and another one of the two through hole lines to encircle the axis extending in the direction orthogonal to the stacking direction of the plurality of dielectric layers.

7. The multilayered filter device according to claim 1, wherein the first conductor layer and the second conductor layer are arranged at a same position in the stacking direction.

8. The multilayered filter device according to claim 1, wherein the first conductor layer and the second conductor layer are arranged at different positions in the stacking direction.

9. The multilayered filter device according to claim 1, wherein the four side surfaces include a first side surface arranged at one end in the direction orthogonal to the stacking direction and a second side surface arranged at another end in the direction orthogonal to the stacking direction, and the second conductor layer includes a first end located at one end of the second conductor layer in a longitudinal direction and a second end located at another end of the second conductor layer in the longitudinal direction and also includes a portion closer to the first side surface than the first end and the second end are.

10. The multilayered filter device according to claim 1, wherein the conductor structure further includes a third conductor layer electrically connected to another end of one of the two through hole lines at a position different from a position of the second conductor layer in the stacking direction, the four side surfaces include a first side surface arranged at one end in the direction orthogonal to the stacking direction and a second side surface arranged at another end in the direction orthogonal to the stacking direction, and the third conductor layer includes a first end located at one end of the third conductor layer in a longitudinal direction and a second end located at another end of the third conductor layer in the longitudinal direction and also includes a portion closer to the first side surface than the first end and the second end are.

11. The multilayered filter device according to claim 1, wherein the at least one parallel resonator includes a first parallel resonator and a second parallel resonator, the at least one serial resonator includes a first serial resonator and a second serial resonator, the first parallel resonator is arranged between the first terminal and the first serial resonator in the circuit configuration, and the second parallel resonator is arranged between the second terminal and the second serial resonator in the circuit configuration.

12. The multilayered filter device according to claim 11, further comprising a through hole electrically connected to the first conductor layer of the first serial resonator and the first conductor layer of the second serial resonator.

13. The multilayered filter device according to claim 11, wherein a first gap is formed between one end and another end of the first conductor layer of the first serial resonator in a longitudinal direction, a second gap is formed between one end and another end of the first conductor layer of the second serial resonator in a longitudinal direction, and the first gap and the second gap are adjacent to each other in the direction orthogonal to the stacking direction.

14. The multilayered filter device according to claim 11, wherein the conductor structure of the first parallel resonator is wound to form a first opening surrounded by the conductor structure, the conductor structure of the second parallel resonator is wound to form a second opening surrounded by the conductor structure, and the conductor structure of the first parallel resonator and the conductor structure of the second parallel resonator are arranged in a longitudinal direction of a plane shape of the stack when seen in the stacking direction, to prevent the first opening and the second opening from facing each other.

15. The multilayered filter device according to claim 11, wherein a first part including the first terminal, the first parallel resonator, and the first serial resonator in the circuit configuration and a second part including the second terminal, the second parallel resonator, and the second serial resonator in the circuit configuration have circuit configurations symmetrical to each other.

16. The multilayered filter device according to claim 11, wherein a plurality of conductors composing a part including the first terminal, the first parallel resonator, and the first serial resonator in the stack are formed to be symmetrical to a plurality of conductors constituting a part including the second terminal, the second parallel resonator, and the second serial resonator in the stack, with respect to a virtual plane parallel to the stacking direction.

\* \* \* \* \*